(12) United States Patent
Ishikawa

(10) Patent No.: US 9,059,718 B2
(45) Date of Patent: *Jun. 16, 2015

(54) SEMICONDUCTOR DEVICE

(71) Applicant: PS4 LUXCO S.A.R.L., Luxembourg (LU)

(72) Inventor: Toru Ishikawa, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

This patent is subject to a terminal disclaimer.

(21) Appl. No.: 14/200,726

(22) Filed: Mar. 7, 2014

(65) Prior Publication Data

US 2014/0184284 A1  Jul. 3, 2014

Related U.S. Application Data

(63) Continuation of application No. 13/067,675, filed on Jun. 20, 2011, now Pat. No. 8,699,286.

(30) Foreign Application Priority Data

Jun. 25, 2010 (JP) ................................. 2010-144367

(51) Int. Cl.
  *G11C 7/00* (2006.01)
  *H03L 7/08* (2006.01)
  *G11C 29/02* (2006.01)

(52) U.S. Cl.
  CPC .............. *H03L 7/0802* (2013.01); *G11C 29/02* (2013.01); *G11C 29/023* (2013.01); *G11C 29/028* (2013.01)

(58) Field of Classification Search
  USPC .............................. 365/194, 191, 193, 189.08
  See application file for complete search history.

(56) References Cited

U.S. PATENT DOCUMENTS

| 6,950,486 B2 * | 9/2005 | Araki ............................. 375/360 |
| 6,970,395 B2 * | 11/2005 | Le et al. .................... 365/233.17 |
| 7,706,210 B2 * | 4/2010 | Kim et al. .................. 365/233.1 |
| 7,724,051 B2 | 5/2010 | Tomar et al. |
| 8,018,261 B2 | 9/2011 | Becker et al. |
| 8,310,886 B2 * | 11/2012 | Rhee et al. .................... 365/194 |
| 8,699,286 B2 * | 4/2014 | Ishikawa ....................... 365/194 |
| 8,766,688 B2 * | 7/2014 | Choi ............................. 327/158 |
| 2002/0153929 A1 | 10/2002 | Yoo |

FOREIGN PATENT DOCUMENTS

JP    2003-58275 A    2/2003

* cited by examiner

*Primary Examiner* — Pho M Luu

(74) *Attorney, Agent, or Firm* — Kunzler Law Group, PC

(57) ABSTRACT

A method for synchronizing an output clock signal with an input clock signal in a delay locked loop. A first count values decreasing the number of bypassed elements in a differential delay line until an edge of the output clock signal is delayed relative to an edge of the input clock signal or the first count value reaches a first count final value if the first count value reaches the first count final value, a second count value is adjusting to decrease the number of bypassed elements in a single-ended delay line until the edge of the output clock signal is delayed relative to the edge of the input clock signal. A third count value is adjusted to decrease the delay of an interpolator until the edge of the output clock signal is no longer delayed with respect to the edge of the input clock signal.

23 Claims, 16 Drawing Sheets

1: SEMICONDUCTOR DEVICE

21: DIFFERENTIAL DELAY ELEMENT

31: SINGLE-ENDED DELAY ELEMENT

23: DIFFERENTIAL TO SINGLE ENDED CONVERSION CIRCUIT

41: PHASE DETECTION CIRCUIT

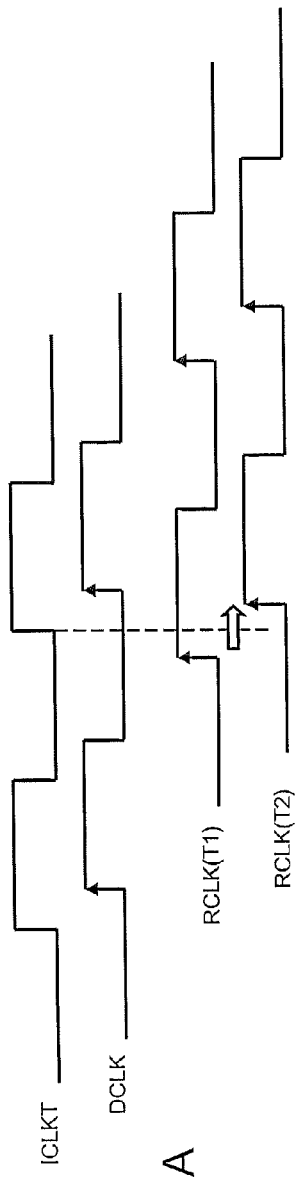
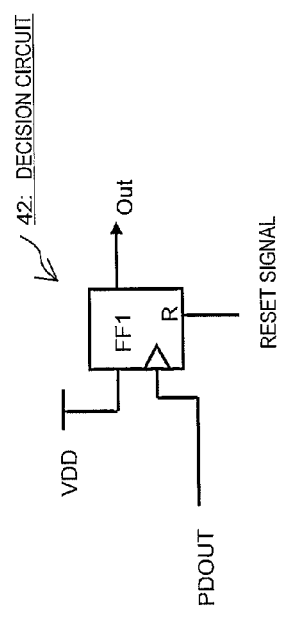
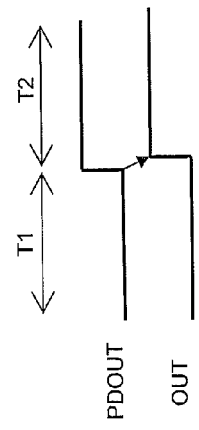
FIG. 6A
FIG. 6B
FIG. 6C

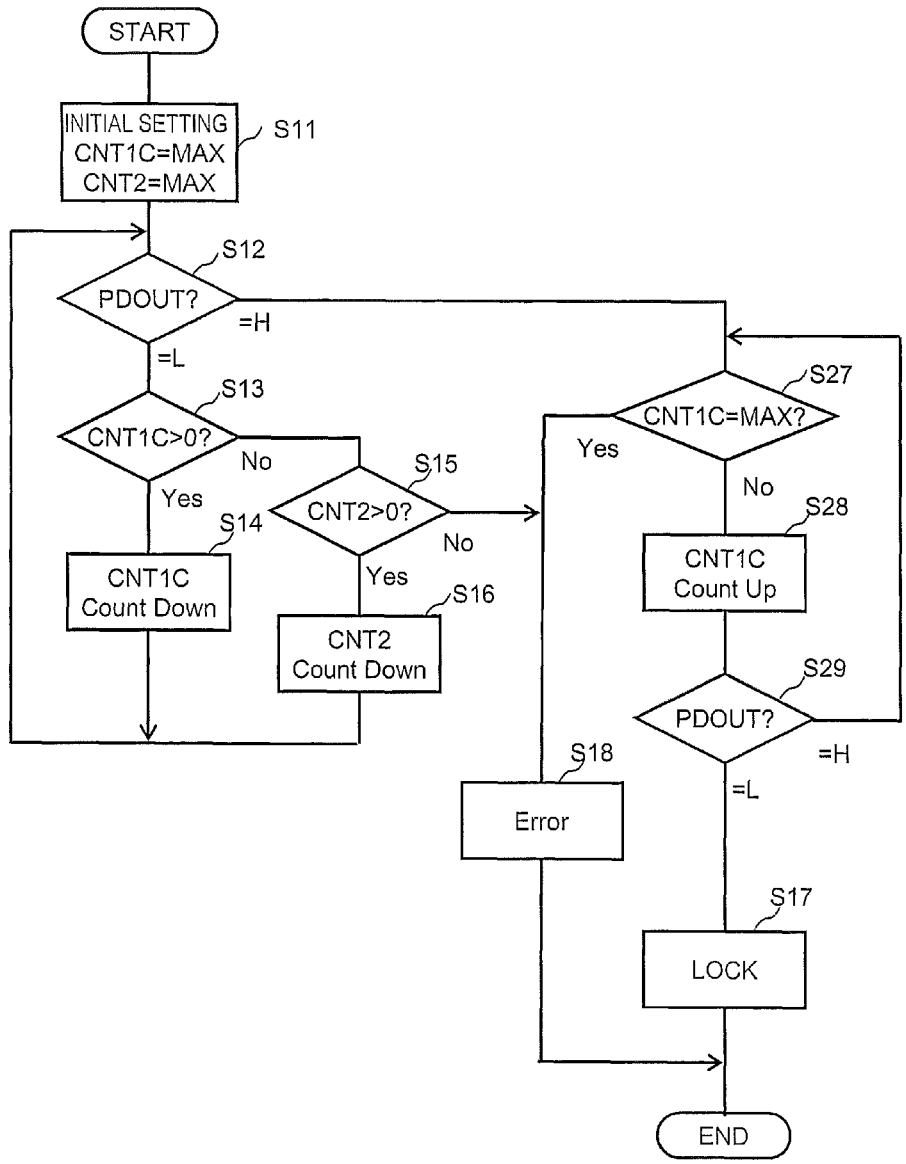

SEMICONDUCTOR DEVICE

This Application is a Continuation Application of U.S. patent application Ser. No. 13/067,675, filed on Jun. 20, 2011, now U.S. Pat. No. 8,699,286.

REFERENCE TO RELATED APPLICATION

This application is based upon and claims the benefit of the priority of Japanese patent application No. 2010-144367, filed on Jun. 25, 2010, the disclosure of which is incorporated herein in its entirety by reference thereto.

TECHNICAL FIELD

The present invention relates to a semiconductor device, and in particular, to a semiconductor device provided with a variable delay circuit such as a DLL (Delay Locked Loop) or the like.

BACKGROUND

In a semiconductor device that operates in synchronization with a clock, such as a synchronous DRAM or the like, in order to operate in synchronization with a system clock supplied from outside, it is necessary to use a variable delay circuit such as a DLL circuit, to accurately adjust delay time of an internal circuit in synchronization with the external clock. For this, various types of adjustment method for the delay time have been proposed.

In particular, Patent Document 1 discloses a variable delay circuit (delay synchronization loop) in which, in order to perform adjustment of the delay time more precisely than by delay time adjustment by changing the number of cascade-connected delay elements, phase delay is increased or decreased more precisely than an increase or decrease of phase delay according to the number of series-connected delay elements by using an input clock signal DCTS having the phase of a reference clock phase variably delayed.
[Patent Document 1]
JP Patent Kokai Publication No. JP-P2003-58275A, which corresponds to US Patent Application Publication No. US2002/0153929A1.

SUMMARY

The entire disclosure of Patent Document 1 is incorporated herein by reference thereto. The following analysis is given by the present invention. In recent years, along with higher frequency clock signals, there is a demand for high accuracy phase adjustment of clock signals. For example, it is considered that performing adjustment using a delay line as in Patent Document 1 is excellent from the viewpoint of layout area. However, delay time of the delay line is affected by power supply noise and the like. That is, for an input clock signal DCTS whose phase is adjusted, as described in Patent Document 1, precise adjustment of less than one delay element provided in the delay line is possible, but since a method described in Patent Document 1 relates to technology that ultimately assumes delay line usage, if a lot of noise is received in the delay line it is difficult to expect high accuracy in the delay time (amount of delay) in a high speed operation region.

On the other hand, in general in one product there is a latitude in required operating frequency range, and as an example, in a synchronous DRAM or the like, a configuration is required that satisfies tCK=2.5 ns-8 ns, which is a clock signal period. The inventor of the present application has focused on the fact that, with regard to this frequency range, a very high adjustment accuracy is required at 2.5 ns (a relatively high speed operation range), and an adjustment accuracy higher than this is required at 8 ns (a relatively low speed operation range). The invention of the present application deals with high speed and low speed operation, and realizes adjustment accuracy and reduction in power consumption, each of which is required.

According to a first aspect of the present invention, a semiconductor device is provided with a delay circuit that includes: a first delay unit that includes a plurality of differential first delay elements which are respectively connected in series, a plurality pairs of first contacts which are respectively provided between the plurality of first delay elements, and a first output circuit that outputs a first delayed signal corresponding to a pair of first contacts selected from among the plurality pairs of first contacts, on receiving a first selection signal; and a second delay unit that receives the first delayed signal, and that includes a plurality of single-ended second delay elements which are respectively connected in series, a plurality of second contacts which are respectively provided between the plurality of second delay elements, and a second output circuit that outputs a second delayed signal corresponding to a second contact selected from among the plurality of second contacts, on receiving a second selection signal; and a control circuit that outputs each of the first and second selection signals.

According to a second aspect of the present invention, a semiconductor device is provided with a delay circuit that delays a pair of input signal and outputs a delayed signal, and a control circuit that controls delay time of the delay circuit; wherein the delay circuit is provided with a first delay unit that receives a pair of differential signals and includes a plurality of cascade-connected first delay elements that output a differential signal, and a second delay unit that receives a single-ended signal, includes a plurality of cascade-connected second delay elements that output a single-ended signal, and is connected in series with the first delay unit; and wherein the control circuit, in a case where a desired delay time is obtained with a delay time of the first delay unit, bypasses each delay element of the second delay unit, and also controls delay time by controlling the number of delay elements that are bypassed, among the plurality of cascade-connected first delay elements, and in a case where a desired delay time is not obtained with a delay time of the first delay unit, controls delay time of the second delay unit by controlling the number of delay elements that are bypassed, among the plurality of cascade-connected second delay elements, and by adding the delay time of the second delay unit to the delay time of the first delay unit, controls overall delay time.

The meritorious effects of the present invention are summarized as follows. According to the present invention, in a case where a required delay time is short, since it is possible to control the delay time using only the differential first delay elements, there is little variation due to noise. Furthermore, a semiconductor device is obtained that is provided with a variable delay circuit in which, in a case where the required delay time is long and the required delay time cannot be obtained with only the first differential delay elements, since it is possible to obtain the required delay time by adding a delay time obtained by the single-ended second delay elements to the delay time of the first differential delay elements, adjustment is possible with high accuracy and without increasing power consumption.

BRIEF DESCRIPTION OF THE DRAWINGS

FIG. 6A is a timing chart of a delayed signal in the first exemplary embodiment; FIG. 6B is a circuit block diagram showing an example of a decision circuit that can be applied to the first exemplary embodiment; and FIG. 6C is a timing chart of a decision circuit.

FIG. 11 is a flow chart showing a delay amount control method (in a case where a delay amount of second delay elements is larger than a delay amount of first delay elements, and fine adjustment is unnecessary) according to the third exemplary embodiment.

PREFERRED MODES

A semiconductor device according to the present invention is provided with a delay circuit including a first delay unit that has a plurality of differential first delay elements which are respectively connected in series, and a second delay unit that has a plurality of single-ended second delay elements which are respectively connected in series; and a control circuit that controls the first delay unit and the second delay unit and controls a delay amount (delay time) of the delay circuit.

From the abovementioned configuration, it is possible to obtain a desired delay amount by using either the differential delay elements or the single-ended delay elements as appropriate. Below, a detailed description is given based on specific exemplary embodiments with regard to modes of the present invention, making reference to the drawings.

First Exemplary Embodiment

Figure 1:
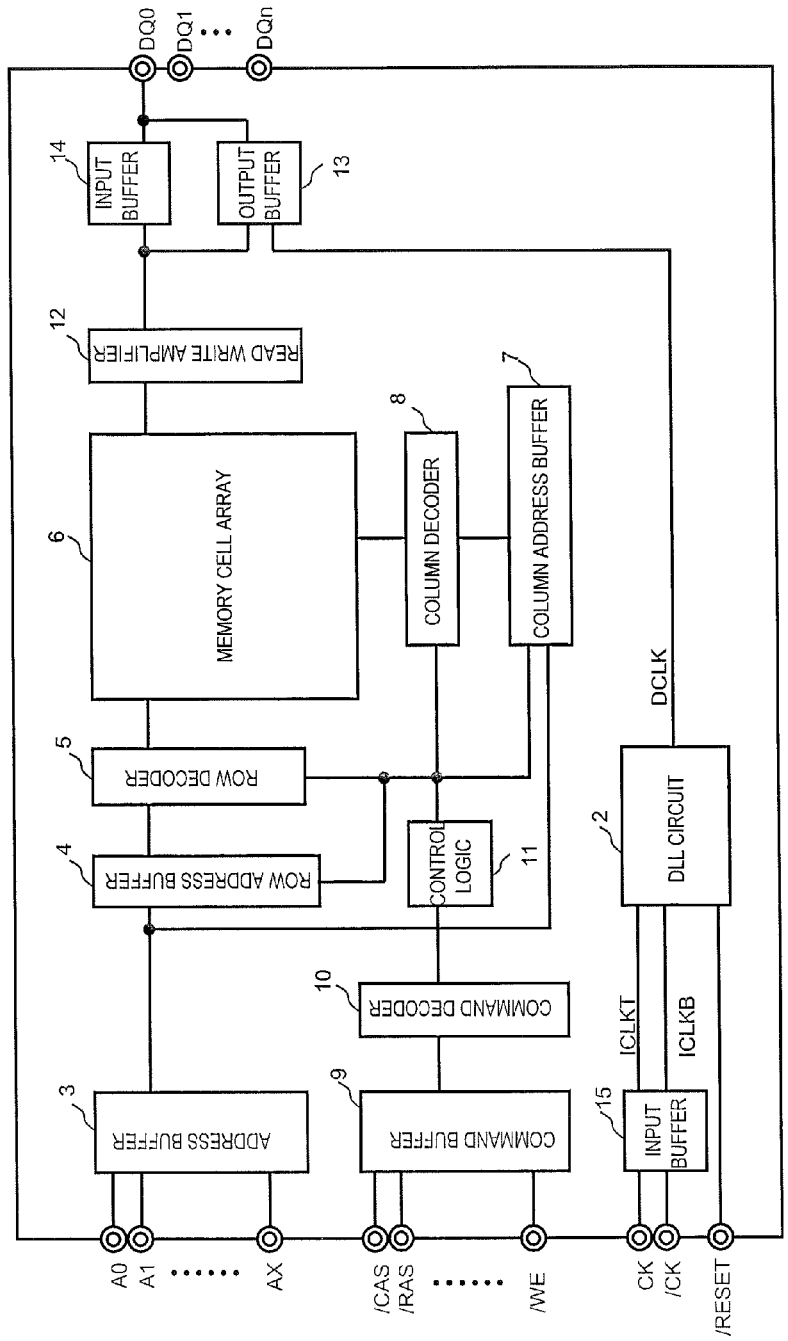
FIG. 1 is a block diagram of an overall semiconductor device according to a first exemplary embodiment of the present invention.

FIG. 1 is a block diagram showing an overall semiconductor device according to a first exemplary embodiment of the present invention. The semiconductor device 1 of FIG. 1 is a synchronous memory. A description is given concerning a configuration of the semiconductor device 1 of FIG. 1. An address buffer 3 is connected to address input terminals A0 to AX, and receives addresses supplied from outside of the semiconductor device 1. A row address buffer 4 further receives a row address, from among addresses received by the address buffer. A row decoder 5 decodes a row address received by the row address buffer 4, and outputs to a memory cell array 6. A column address buffer 7 receives and latches a column address, from among the addresses received by the address buffer 3. A column decoder 8 decodes a column address received by the column address buffer 7, and outputs to the memory cell array 6. With regard to the memory cell array 6, a memory cell to be accessed is selected from a plurality of memory cells included in the memory cell array 6 based on a row address outputted from the row decoder 5 and a column address outputted from the column decoder 8, and is made accessible from outside.

A command buffer 9 receives, from outside of the semiconductor device 1, signals (command signals) that determine operation of the semiconductor device 1 such as a column address strobe signal /CAS, a row address strobe signal /RAS, a write enable signal /WE, and the like. It is to be noted that "/" in /CAS, /RAS, /WE and the like, indicates an active row signal. The same applies below in the present specification. A command decoder 10 decodes a command signal received by the command buffer. Control logic 11 controls operation of the row address buffer 4, the row decoder 5, the column address buffer 7, and the column decoder 8, based on a command signal decoded by the command decoder 10. In a case where an operation is that of read access with respect to the memory cell array, a read write amplifier 12 amplifies data read from a specified address of the memory cell array, and outputs to an output buffer 13. Furthermore, in a case where an operation is that of write access with respect to the memory cell array, the read write amplifier 12 amplifies write data received from an input buffer 14, and writes to a specified address of the memory cell address 6.

An input buffer 15 receives a non-inverted clock signal CK and an inverted clock signal /CK supplied from outside, and outputs to a DLL circuit 2, as a non-inverted internal clock signal ICLKT and an inverted internal clock signal ICLKB. The DLL circuit 2 outputs a delayed clock signal DCLK at a single level with phase adjusted based on the non-inverted and the inverted internal clock signals ICLKT and ICLKB, to the output buffer 13. When a read command is executed, the output buffer 13 outputs read data received from the read write amplifier 12, in synchronization with the delayed clock signal DCLK, from data input-output terminals DQ0 to DQn. Furthermore, the input buffer 14 outputs write data received from the data input-output terminals DQ0 to DQn when a write command is executed to the read write amplifier 12.

When a read command is executed, the read data, which is outputted to outside of the semiconductor device 1 via the data input-output terminals DQ0 to DQn from the output suffer 13, can be outputted with phase adjusted at required timing in accurate synchronization with clock signals CK and /CK supplied from outside according to the delayed clock signal DCLK outputted by the DLL circuit 2. The DLL circuit 2 has a characteristic. It is to be noted that the semiconductor device 1 shown in FIG. 1 is an example of a semiconductor device to which the present invention can be preferably applied, and semiconductor devices to which the present invention can be applied are not limited to a synchronous memory described in FIG. 1.

Figure 2:
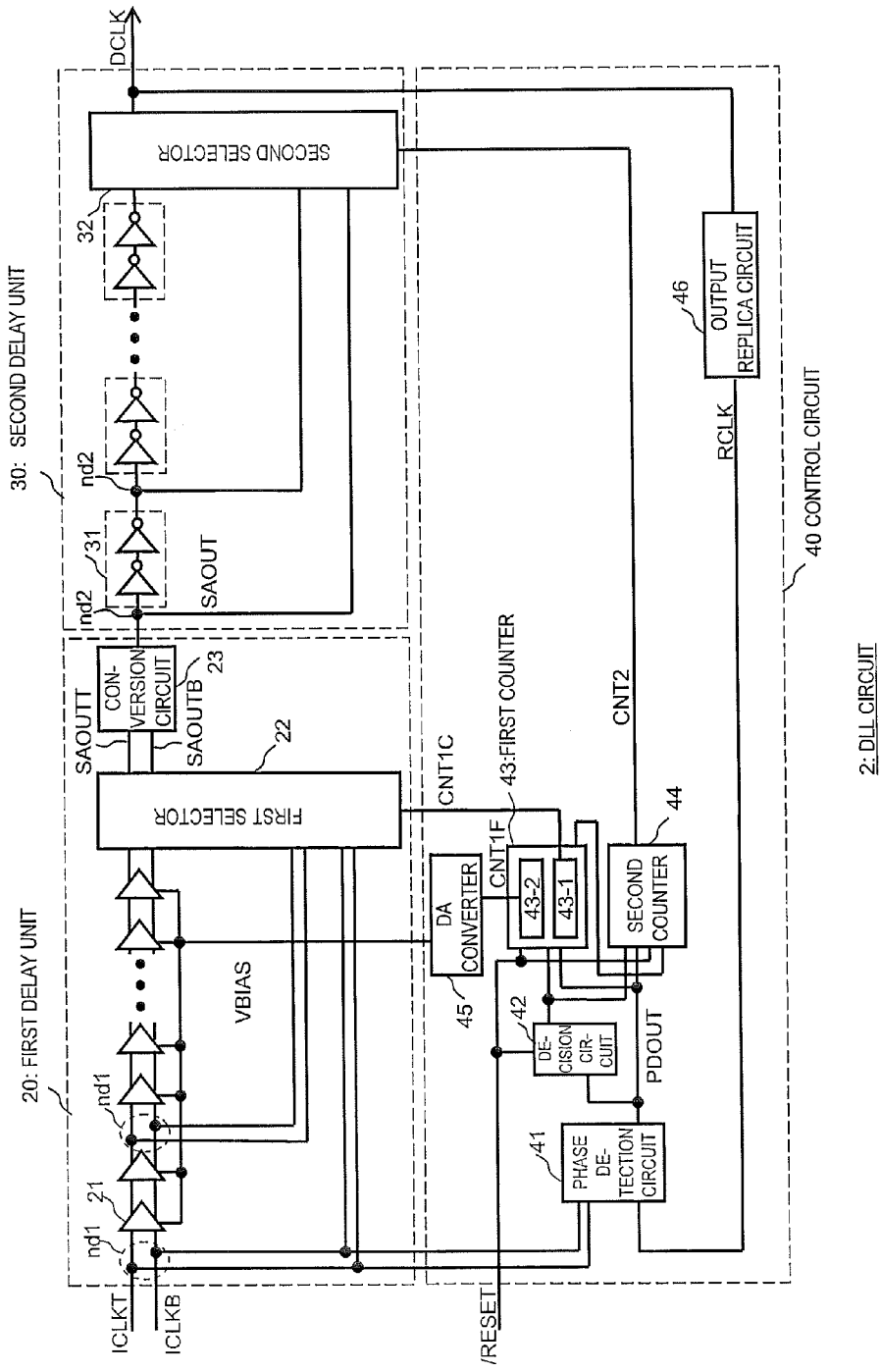
FIG. 2 is a block diagram of a DLL circuit in the first exemplary embodiment.

FIG. 2 is a block diagram showing an internal configuration of the DLL circuit 2 of FIG. 1. Using FIG. 2, a description is given of the internal configuration of the DLL circuit 2 of the first exemplary embodiment. The DLL circuit 2, broadly divided, is provided with a delay circuit including a first delay unit 20 and a second delay unit 30, and a control circuit 40 that controls delay time of the delay circuit. The delay circuit receives the non-inverted clock signal ICLKT and the inverted clock signal ICLKB, which are differential clock signals, applies a required delay, and outputs a single-ended delayed clock signal DCLK. A path on which the differential clock signals ICLKT and ICLKB are received and the delayed clock signal DCLK is outputted is a delay path, and the control circuit 40 controls the delay amount (delay time).

The first delay unit 20 is provided with a plurality of cascade-connected differential first delay elements (differential delay elements) 21; a first selector 22 that, among a plurality of first contacts nd1, with the first contacts nd1 being arranged and connected in parallel at each input terminal and output terminal of each of the first delay elements 21, selects and outputs a pair of signals of a selected pair of first contacts nd1; and a differential to single-ended conversion circuit 23 that converts differential signals SAOUTT and SAOUTB, which are outputted by the first selector 22, to a single-ended signal SAOUT, to be outputted.

Figure 16:
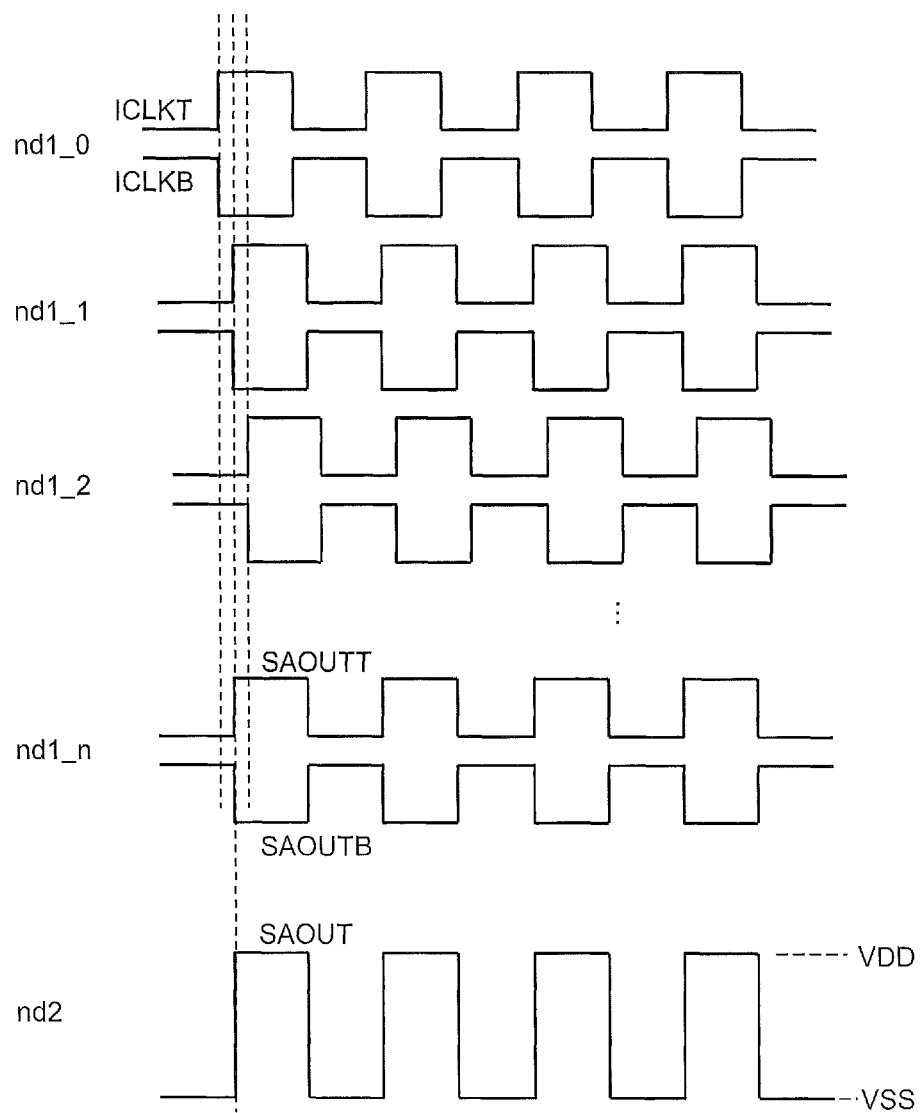
FIG. 16 shows an example of phases and amplitudes of first delay elements, a first selector, and a conversion circuit in a first exemplary embodiment.

Among the plurality of cascade-connected first delay elements of the first delay unit 20, the non-inverted clock signal ICLKT and the inverted clock signal ICLKB are connected as differential input signals (differential clock signals) to a leading first delay element 21. Furthermore, the non-inverted clock signal ICLKT and the inverted clock signal ICLKB are also connected to the first selector 22 as first contacts nd1. In addition, among the cascade-connected first delay elements 21, a differential output signal of a previous stage is connected as a differential input signal to a delay element 21 of a later stage, outside of the leading delay element 21. The differential output signals of a previous stage are also connected to the first selector 22, each as a different first contact nd1. Among the plurality of cascade-connected first delay elements, a final stage delay element 21 is connected to only the first selector 22. Further, the configuration is such that a bias voltage VBIAS is given by a DA converter 45 of the control circuit 40 to each of the first delay elements 21, and a delay time of each of the first delay elements 21 can be finely adjusted. FIG. 16 shows an example of phases and amplitudes of the first delay elements 21, the first selector 22, and the conversion circuit 23. The amplitudes of output signals of the first delay elements 21 and the first selector 22 are restricted, and the output signal of the conversion circuit 23 has full amplitude between VDD and VSS. The first selector 22 selects nd1_1 nodes of the first delay elements 21 and outputs SAOUTT and SAOUTB signals. The conversion circuit 23 increases the amplitude of SAOUTT and SAOUTB signals and outputs SAOUT signal.

The second delay unit 30 is provided with a plurality of cascade-connected single-ended second delay elements (single-ended delay elements) 31, and a second selector 32 that, among a plurality of second contacts nd2, with the second contacts nd2 being arranged and connected in parallel at each input terminal and output terminal of each of the second delay elements 31, selects a signal of a selected contact nd2, to be outputted as the delayed clock signal DCLK.

Among the plurality of cascade-connected second delay elements 31 of the second delay unit 30, a single-ended signal SAOUT outputted by the differential to single-ended conversion circuit 23 is connected as a single-ended input signal to a leading first delay element 31. Furthermore, the single-ended signal SAOUT is also connected to the second selector 32 as a second contact nd2. In addition, among the cascade-connected second delay elements 31, a single-ended output signal of a previous stage is connected as a single-ended input signal to a delay element 31 of a later stage, outside of the leading delay element 31. The single-ended output signals of a previous stage are also connected to the second selector 32, each as a different second contact nd2. Among the plurality of cascade-connected second delay elements 31, an output signal of final stage delay element 31 is connected to only the second selector 32. It is to be noted that in the first exemplary embodiment the delay time for one of the second delay elements 31 is preferably approximately equal to the delay time for one of the first delay elements 21. As a preferable example, the number of cascade-connected first delay elements 21 is 8, the number of second delay elements 31 is 24, and delay amount center values of the first delay elements and the second delay elements are each 0.2 ns.

In the control circuit 40, the delayed clock DCLK is received as a feedback clock RCLK by a phase detection circuit 41 via an output replica circuit 46 that delays the delayed clock DCLK by an amount equivalent to a delay in the output buffer 13, which is an output destination of the delayed clock DCLK. That is, the phase of the delayed clock DCLK is further delayed by the output replica circuit 46, to have the feedback clock RCLK. By comparing the phase of this feedback clock RCLK with the phase of the internal clock signals (ICLKT and ICLKB), it is possible to accurately synchronize the phase of a read data output signal outputted from the data input-output terminals DQ0 to DQn with clock signals CK and /CK supplied from external input terminals.

The phase detection circuit 41 compares the phases of differential input clock signals, which are the non-inverted clock signal ICLKT and the inverted clock signal ICLKB, with the feedback clock signal RCLK that is single-ended, and outputs a result thereof as a phase detection signal PDOUT. A decision circuit 42 measures change in output level of the phase detection signal PDOUT outputted by the phase detection circuit 41, and decides whether or not the delay times of the first delay unit 20 and the second delay unit 30 have been set to a desired delay time. A first counter 43 and a second counter 44 are each configured by a down counter, and selection control by the first selector 22 and the second selector 32 is performed according to count values thereof.

The first counter 43 is provided internally with a rough adjustment counter 43-1 and a fine adjustment counter 43-2. The rough adjustment counter 43-1 outputs its numerical count value as a first delay unit rough adjustment signal CNT1C, and controls selection by the first selector 22. CNT1C, which is the numerical count value of the rough adjustment counter 43-1, represents the number of first delay elements 21 bypassed by the first selector, among the plural cascade-connected first delay elements 21. That is, when the first selector selects the non-inverted clock signal ICLKT and the inverted clock signal ICLKB, since all of the first delay elements 21 are bypassed, the numerical count value of the rough adjustment counter 43-1 is at a maximum value (the same as the number of first delay elements 21). On the other hand, when the first selector selects output of the final stage first element 21 among the cascade-connected first delay elements 21, since the number of bypassed first delay elements 21 is 0, the numerical count value of the rough adjustment counter 43-1 is 0. In the first exemplary embodiment, the numerical count value of the first counter 43 is set at the maximum value (the same as the number of cascade-connected first delay elements 21) according to an initial setting.

Furthermore, the fine adjustment counter 43-2 outputs its numerical count value as a first delay unit fine adjustment signal CNT1F, and controls output voltage of the DA converter 45. The DA converter 45 converts the first delay unit fine adjustment signal CNT1F given as a digital value to a bias voltage VBIAS, and performs fine adjustment of the delay time of the first delay elements.

The second counter 44 outputs its numerical count value as a second delay unit adjustment signal CNT2, and controls selection by the second selector 32. CNT2, which is the numerical count value of the second counter 44, represents the number of second delay elements bypassed by the second selector, among the plurality of cascade-connected second delay elements 31. That is, when the second selector selects the first delayed clock signal SAOUT outputted by the first delay unit 20, since all of the second delay elements 31 are bypassed, the numerical count value of the second counter 44 is at a maximum value (the same as the number of second delay elements 31). On the other hand, when the second selector selects output of the final stage second delay element 31, among the cascade-connected second delay elements 31, since the number of bypassed second delay elements 31 is 0, the numerical count value of the second counter 44 is 0. The numerical count value of the second counter 44 is set at the maximum value (the same as the number of cascade-connected first delay elements) according to an initial setting. That is, the second selector is initially set to a state where all of the second delay elements 31 are bypassed.

Figure 3A:
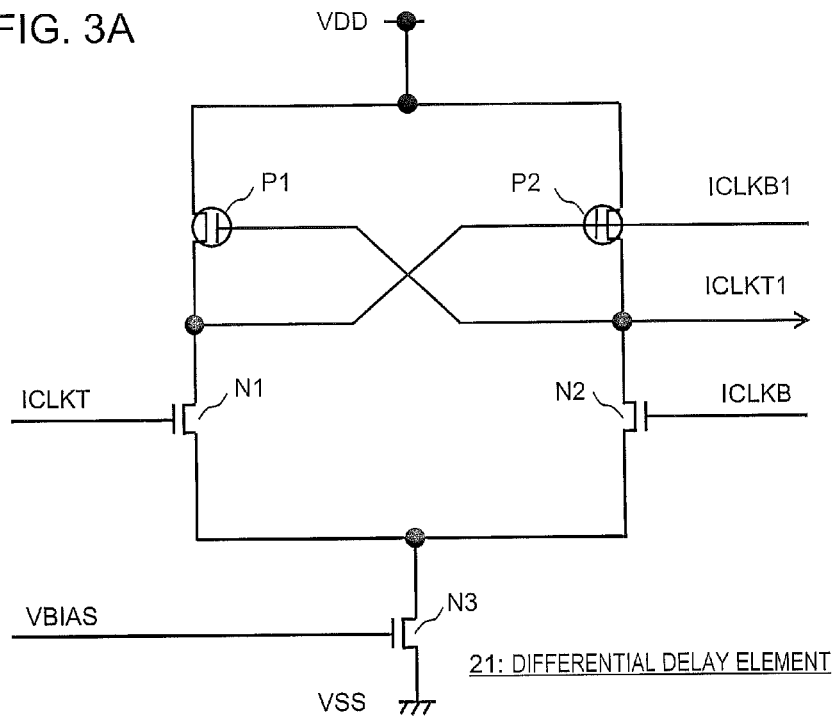
FIG. 3A is a circuit block diagram showing an example of a differential delay element and FIG. 3B is a circuit block diagram showing an example of a single-ended delay element, which can be applied to the first exemplary embodiment.
Figure 3B:
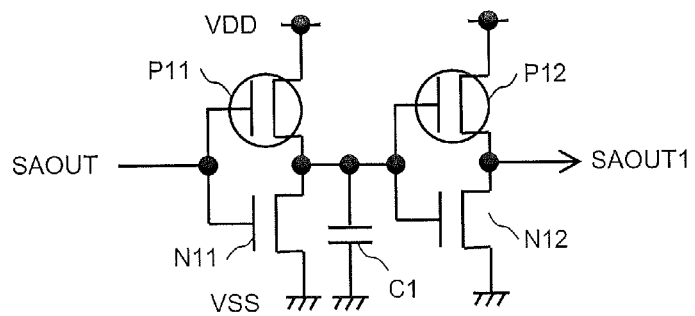

Next, FIG. 3A and FIG. 3B respectively show circuit block diagrams of a differential delay element that can be applied as a first delay element 21 of the first delay unit of FIG. 2, and of a single-ended delay element that can be applied as a second delay element 31 of the second delay unit. The differential delay element 21 that can be applied as a first delay element as described in FIG. 3A is provided with an N channel MOS transistor N3 having the bias voltage VBIAS outputted by the DA converter 45 (refer to FIG. 2) connected to a gate, and a source connected to a low potential side power supply VSS; and a differential pair provided with an N channel MOS transistor N1 having a gate connected to a non-inverted clock signal input terminal ICLKT, and an N channel MOS transistor N2 having a gate connected to an inverted clock signal input terminal ICLKB, the N channel MOS transistors N1 and N2 having respective sources commonly connected to a drain of the N channel MOS transistor N3.

In addition, the differential delay element 21 is provided with a P channel MOS transistor P1 having a source connected to a high potential side power supply VDD, and a gate connected to a drain of the N channel MOS transistor N2, and a P channel MOS transistor P2 having a source connected to a high potential side power supply VDD, and a gate connected to a drain of the N channel MOS transistor N1. A drain of the P channel MOS transistor P1 is commonly connected with the drain of the N channel MOS transistor N1, and is connected to an inverted clock signal input terminal of the differential delay element of a subsequent stage as an inverted output signal ICLKB1. Furthermore, a drain of the P channel MOS transistor P2 is commonly connected with the drain of the N channel MOS transistor N2, and is connected to a non-inverted clock signal input terminal of the differential delay element 21 of a subsequent stage as a non-inverted output signal ICLKT1.

In the single-ended delay elements 31 that can be applied as the second delay elements as described in FIG. 3B, a CMOS inverter is 2-stage cascade-connected, and a signal received from a single-ended input terminal SAOUT is delayed and outputted from a single-ended output terminal SAOUT1. It is to be noted that a capacitor C1 is connected to a connection node in the middle of the 2-stage cascade-connected CMOS inverter and delay time is gained. It is to be noted that the differential delay element 21 shown in FIG. 3A, and the single-ended delay element 31 shown in FIG. 3B are examples of a differential delay element and a single-ended delay element respectively, and if the differential delay element has differential input and differential output, and the single-ended delay element has single-ended input and single-ended output, delay elements of configurations outside of the delay elements shown as examples in FIG. 3 may be used. Furthermore, the single-ended delay element may use a delay element of either of an inverted output delay element or a non-inverted output delay element with regard to input logic, but in order that logic is not inverted when bypassing by a selector circuit occurs, the single-ended delay element is preferably a single-ended delay element with non-inverted output, which outputs from an output terminal an output signal of similar phase to a signal received at an input terminal.

Figure 4:
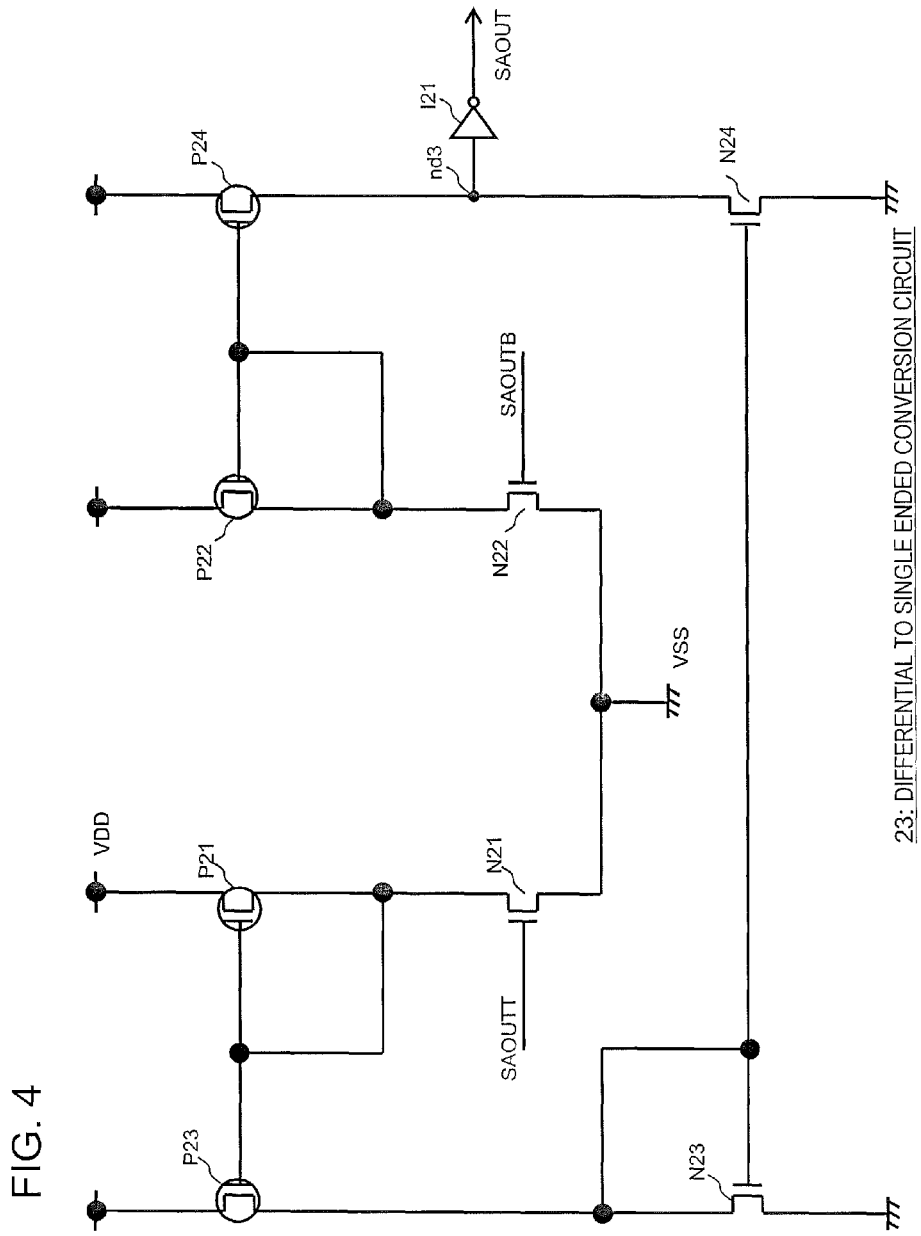
FIG. 4 is a circuit block diagram showing an example of a differential to single-ended conversion circuit that can be applied to the first exemplary embodiment.

FIG. 4 shows an example of a differential to single-ended conversion circuit 23 that can be applied as the differential to single-ended conversion circuit 23 of FIG. 2. The differential to single-ended conversion circuit 23 described in FIG. 4 is provided with a pair of transistors (N channel MOS transistors N21 and N22) having power supplies (sources) commonly connected to a low potential side power supply VSS, and a pair of first delayed clock signals SAOUTT and SAOUTB, being differential signals, connected to respective input terminals (gates) thereof.

Furthermore, the differential to single-ended conversion circuit 23 is provided with a current mirror circuit (P channel MOS transistors P21 and P23, and N channel MOS transistors N23 and N24) in which a current proportional to a current flowing in a current path (between source and drain) of the N channel MOS transistor N21, which is a first transistor among the pair of transistors (N channel MOS transistors N21 and N22), is made to flow from a third contact nd3 to a low potential side power supply VSS. In addition, the differential to single-ended conversion circuit 23 is provided with a current mirror circuit (P channel MOS transistors P22 and P24) in which a current proportional to a current flowing in a current path (between source and drain) of the N channel MOS transistor N22, which is a second transistor among the pair of transistors (N channel MOS transistors N21 and N22), is made to flow to the third contact nd3 from a high potential side power supply VDD.

That is, the potential of the third contact nd3 is determined according to the value of an in-flowing current from the P channel MOS transistor P24 and an out-flowing current from the N channel MOS transistor N24. In addition, the current flowing in the P channel MOS transistor P24 is determined according to the current flowing in the N channel MOS transistor N22, and the current flowing in the N channel MOS transistor N24 is determined according to the current flowing in the N channel MOS transistor N21. Therefore, it is possible to convert a potential difference of differential signals received by the N channel MOS transistor N21 and the N channel MOS transistor N22 to a voltage at the third contact nd3. The voltage at the third contact nd3 is converted to a single-ended first delayed signal by an inverter 121 to be outputted.

Figure 5:
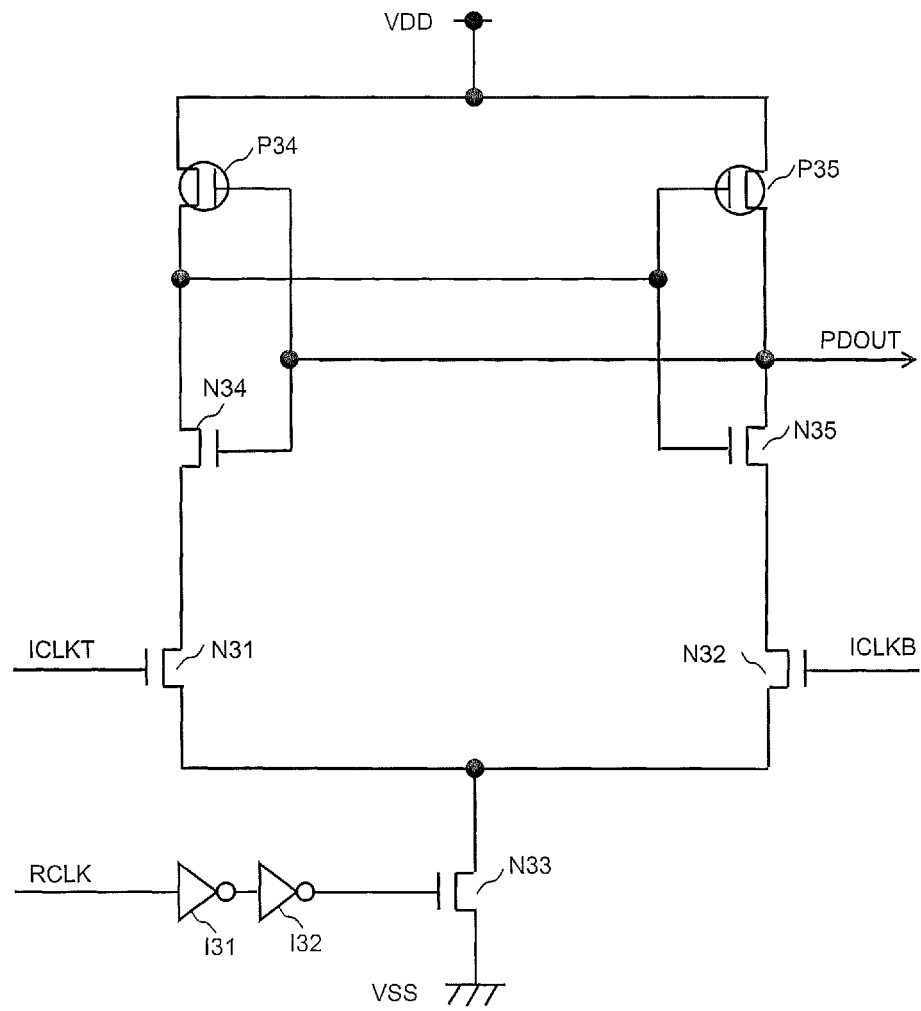
FIG. 5 is a circuit block diagram showing an example of a phase detection circuit that can be applied to the first exemplary embodiment.

FIG. 5 shows an example of a preferred phase detection circuit as the phase detection circuit 41 of FIG. 2. The phase detection circuit 41 of FIG. 5, in particular, is a phase detection circuit suitable for comparing phases of differential signals (for example, ICLKT and ICLKB) and a single-ended signal (for example, RCLK). An N channel MOS transistor N33, which is a current source transistor of the phase detection circuit 41, has a source connected to a low potential side power supply VSS, and a gate connected to an output signal obtained by the feedback clock signal RCLK being waveform-shaped by inverters 131 and 132. Furthermore, there is provided a differential pair of N channel MOS transistors N31 and N32, having sources commonly connected to a drain of an N channel MOS transistor N33, and gates respectively connected to the pair of differential clock signals (ICLKT and ICLKB).

In addition, an inverter circuit formed from a PMOS transistor P34 and an NMOS transistor N34, and an inverter circuit formed from a PMOS transistor P35 and an NMOS transistor N35 are respectively connected between drains of the differential pair of the N channel MOS transistors N31 and N32 and a high potential side power supply VDD. An output terminal of the inverter circuit formed from a PMOS transistor P35 and an NMOS transistor N35 outputs a phase detection signal PDOUT. These two inverter circuits form a flip-flop circuit in which an output terminal of a first of the inverter circuits is connected to an input terminal of a second of the inverter circuits, and an output terminal of the second of the inverter circuits is connected to an input terminal of the first of the inverter circuits.

In this flip-flop circuit, a state is set according to voltage level of the pair of differential signals (ICLKT and ICLKB) when the feedback clock signal RCLK goes to a high level and the N channel transistor N33, which is a current source transistor, is conductive. That is, when the feedback clock signal RCLK is at a high level, if the voltage level of the non-inverted clock signal ICLKT is higher than the voltage level of the inverted clock signal ICLKB, the phase detection signal PDOUT is outputted at a high level. Conversely, when the feedback clock signal RCLK is at a high level, if the voltage level of the non-inverted clock signal ICLKT is lower than the voltage level of the inverted clock signal ICLKB, the phase detection signal PDOUT is outputted at a low level. In this way it is possible to compare phases of the single-ended feedback clock signal RCLK and the differential clock signals (ICLKT and ICLKB).

FIG. 6B shows an example of a configuration of the decision circuit 42. The decision circuit 42 of FIG. 6B is configured by a data flip-flop FF1, in which a data input terminal is connected to a high potential side power supply VDD, a clock input terminal is connected to the phase detection signal PDOUT that is an output signal of the phase detection circuit 41, a reset signal is connected to a reset terminal, and a decision signal OUT is outputted. This decision circuit 42 initializes a decision signal OUT to a low level by the reset signal. After reset release, when the phase detection signal PDOUT goes to a high level, the decision signal OUT is at a high level. When the decision signal OUT goes to a high level, the rough adjustment counter 43-1 of the first counter 43 and the second counter 44 stop counting operations, and the rough adjustment is completed.

Figure 7:
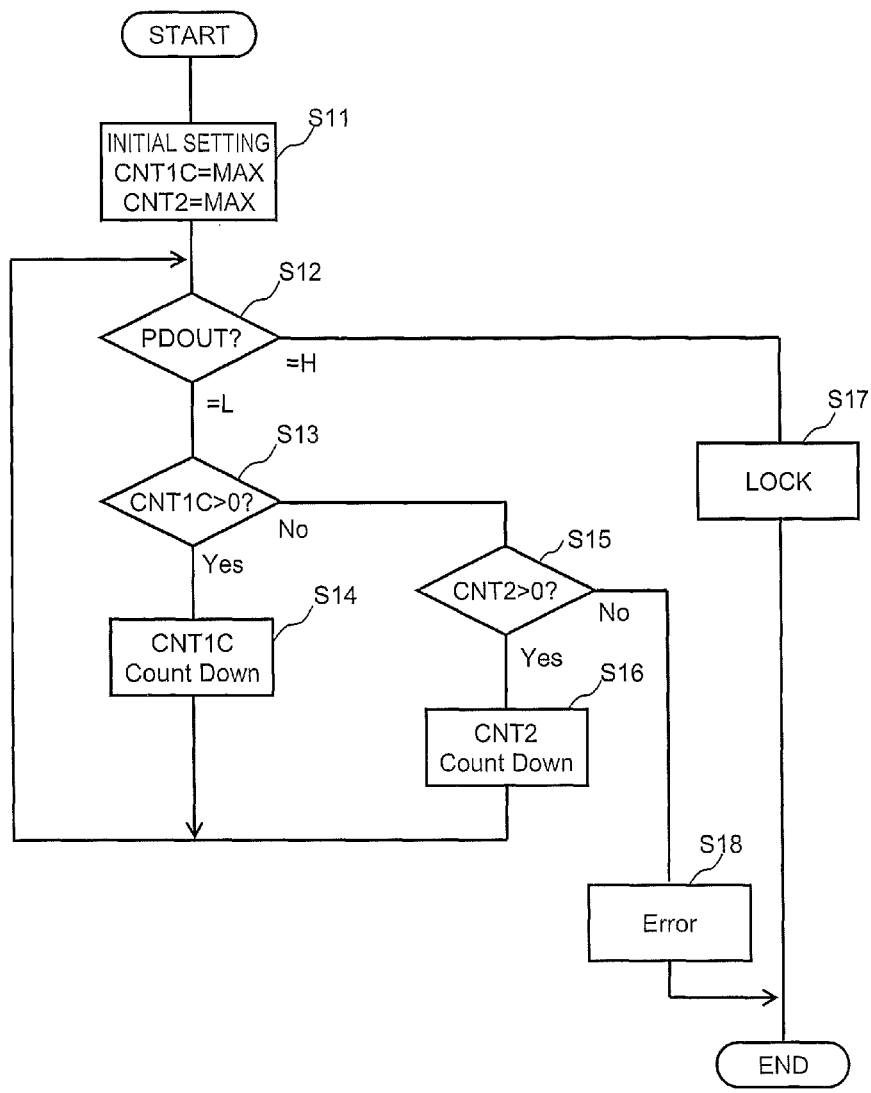
FIG. 7 is a flow chart showing a delay amount control method (in a case where delay amounts of first delay elements and second delay elements are approximately the same and fine adjustment is unnecessary) according to the first exemplary embodiment.

Next, a description is given concerning operation of the DLL circuit 2 of the first exemplary embodiment shown in FIG. 2, using a flowchart of FIG. 7, timing charts of the internal clock signal ICLKT, the delayed clock signal DCLK, and the feedback clock signal RCLK of FIG. 6A, and timing charts of the phase detection signal PDOUT and the output signal OUT of the decision circuit of FIG. 6C. In the first exemplary embodiment, with regard to FIG. 2, the delay time of the first delay elements 21 of the first delay unit 20 and the delay time of the second delay elements 31 of the second delay unit are approximately equal. In the flowchart of FIG. 7, in step S11 the entire DLL circuit 2 is initialized by the reset signal. At this time, the count value CNT1C of the rough adjustment counter 43-1 of the first counter 43, and the count value CNT2 of the second counter 44 are given initial settings to a maximum value MAX. That is, the first selector 22 and the second selector 32 are initially set to a state in which all of the first delay elements 21 and the second delay elements 31 are bypassed. Furthermore, the decision signal OUT of the decision circuit 42 is given an initial setting to a low level.

When the initial setting is finished in this state and the internal clock signals (ICLKT and ICLKB) are received, the phase detection circuit 41 starts phase detection of the internal clock signals (ICLKT and ICLKB) and the feedback clock signal RCLK. It is to be noted that, as shown in FIG. 6A, the phase detection circuit 41 compares the phase of the delayed clock signal RCLK, which is delayed by one period with regard to the internal clock signals (ICLKT and ICLKB). It is to be noted that in FIG. 6A, among the internal clock signals only the non-inverted clock signal ICLKT is illustrated, and illustration of the inverted clock signal ICLKB is omitted, but the phase of the inverted clock signal ICLKB lines up inversely with the phase of the non-inverted clock signal ICLKT. Furthermore, in FIG. 6A, with regard to a waveform of the feedback clock RCLK, both RCLK(T1) and RCLK(T2) are shown; RCLK(T1) illustrates a state in which the phase of the feedback clock RCLK is advanced with respect to the internal clock ICLKT, and RCLK(T2) illustrates a state in which the phase of the feedback clock RCLK is delayed with respect to the internal clock ICLKT.

Since after the initial setting, the first selector 22 and the second selector 32 are initially set such that the first delay elements 21 and the second delay elements 31 are all bypassed, an expected operation after the initial setting is an operation in which in RCLK(T1) has a state where the phase of the feedback clock signal RCLK is more advanced than that of the internal clock signal ICLKT. In this case, the phase detection circuit 41 outputs the phase detection signal RDOUT at a low level. That is, in step S12 of the flowchart of FIG. 7, PDOUT=L, and control proceeds to step S13.

In step S13, since the value of CNT1C is initially set to a maximum value in the initial setting, CNT1C>0 should hold. In this case, control proceeds to step S14, the rough adjustment counter 43-1 of the first counter counts downward by 1, and the number of bypassed first delay elements 21 is decreased by 1. That is, since the number of first delay elements included in a delay path is increased by 1, the delay time of the first delay unit is increased. It is to be noted that in a case where the phase of the feedback clock RCLK is advanced, the delay path is added to, by giving priority to the first delay elements rather than the second delay elements, because the first delay elements are differential delay elements and are less affected by noise than the second delay elements, which are single-ended delay elements.

Next, returning to step S12, once again phases of the internal clock signal ICLK and the feedback clock signal RCLK are compared by the phase detection circuit 41. A loop from this step S12 to step S13 and step S14 is repeated until the phase detection circuit 41 detects that the phase detection signal PDOUT=H in step S12, or CNT1C=0 in step S13. In step S13, CNT1C=0 occurs in a case where the first delay elements 21 of the first delay unit 20 are all included in the delay path, and there are no longer first delay elements 21 that are bypassed. In this case, since it is not possible to further increase the delay time of the first delay unit, it becomes necessary to include the second delay elements 31 of the second delay unit 30 in the delay path.

When a decision of No is made in step S13, control proceeds to step S15. Initially when a decision of No is made in step S13 and control proceeds to step S15, since the second counter 44 still has an initial setting valve of MAX, CNT2>0 should hold. Therefore, control proceeds to step S16 and the numerical count value CNT2 of the second counter 44 is counted downward by 1. Counting down the numerical count value CNT2 of the second counter 44 by 1 decreases, among the plurality of cascade-connected second delay elements 31, the second delay elements 31 that are bypassed, by 1, and one of the second delay elements 31 is included in the delay path. Therefore, the phase of the feedback clock RCLK is delayed by this amount. Progression to this step S16 is only in a case where a decision of No is made in step S13, and is limited to a case where even with the first delay elements 21 all being included in the delay path, the phase of the feedback clock RCLK is still too fast.

After step S16, control returns again to step S12, and a loop of steps S12, step S13, step S15, and step S16 is repeated until PDOUT=H holds. During processing of this loop when a decision of No is made in step S15, even when the first delay elements 21 and the second delay elements 31 are all included in the delay path, the phase of the feedback clock RCLK is still too advanced with respect to the internal clock ICLK, since there is no means to further increase the delay time of the delay path, control proceeds to error processing in step S18, and the processing is finished. For example, in a case where frequencies of clock signals CK and /CK received from outside are delayed frequencies outside of a specified range, there is a possibility of this type of error occurring.

On the other hand, by including the first delay elements 21 in step S14 or the second delay elements 31 in step S16 in the delay path, in a case where the phase of the feedback clock RCLK is delayed with respect to the internal clock ICLKT, the phase of the feedback clock RCLK in FIG. 6A transitions from a state of RCLK(T1) to a state of RCLK(T2). The phase detection signal PDOUT outputted by the phase detection circuit 41 then rises from a low level to a high level. As shown in FIG. 6C the decision circuit 42 then raises the decision signal OUT from a low level to a high level. When the decision signal OUT goes to a high level, the rough adjustment counter 43-1 of the first counter and the second counter 44 stop counting operations, the DLL circuit 2 is in a locked state, and the rough adjustment is completed. In the flowchart of FIG. 7, in a case where a judgment of PDOUT=H is made in step S12, control proceeds to step S17 and the rough adjustment is completed.

Thereafter, in a case where further fine adjustment is necessary, the numerical count value CNT1F of the fine adjustment counter 43-2 of the first counter 43 is counted up or counted down by a logic level of the phase detection signal PDOUT outputted by the phase detection circuit 41, the voltage VBIAS outputted by the DA converter 45 is adjusted by the numerical count value CNT1F of the fine adjustment counter 43-2, and fine adjustment is performed so that a phase difference no longer exists between the internal clock ICLK and the feedback clock. An initial setting value of the fine adjustment counter 43-2 is preferably set to a mid-value of a counter range of the fine adjustment counter, and at this time the bias voltage VBIAS is set to a center value of adjustable voltage. It is to be noted that the delay amount (delay time) that can be adjusted by fine adjustment of the bias voltage VBIAS is preferably an amount at which delay time of two of the first delay elements 21 and the second delay elements 31 can be adjusted.

According to the first exemplary embodiment as described above, in a case where the period of the clock signal CK supplied from outside is at a high frequency close to a specified upper limit, it is possible to adjust the delay time using only the first delay elements 21, which are differential delay elements, and it is possible to adjust the delay time without using the single-ended delay elements 31 in the delay path. Therefore, since the delay amount is adjusted using the differential delay elements that are robust against noise, even if noise is received, it is possible to output signals accurately synchronized with respect to the external clock signal CK without misalignment of synchronization.

On the other hand, in a case where the period of the clock signal CK supplied from outside is at a relatively slow frequency within a specified range, it is possible to adjust the delay time using the second delay elements 31, which are single-ended delay elements, in addition to the differential delay elements 21. In this case, since the single-ended delay elements 31 are used, a noise effect easily occurs in comparison with a case of using only the differential delay elements 21. However, since the period of the clock signal CK is at a relatively slow frequency, even if there is some disturbance in the phase of the delayed clock DCLK due to noise, there is little effect on the semiconductor device 1 or the overall system.

Furthermore, in the single-ended delay element using a CMOS inverter or the like, an example of which is described in FIG. 3B, although current flows when a received signal rises or falls, a received signal has a relatively low frequency, and when a high level or a low level is maintained, the current does not flow. On the other hand, with the differential delay element such as described in FIG. 3A, current constantly flows even when there is no received signal. Therefore, when the frequency of the external clock signal CK is slow, there is risk that when an attempt is made to adjust all of the delay elements on the delay path with only the number of differential delay elements, the number of differential delay elements used in the delay path becomes large, and consumed current flowing in the delay circuit increases. According to the first exemplary embodiment, by reducing the number of differential delay elements 21 of the first delay unit to a number necessary for ensuring clock accuracy, and outside of those, by using the single-ended delay elements of the second delay unit, when the frequency of the external clock is fast, it is possible to output a clock at high accuracy without being affected by noise, and when the frequency of the external clock is relatively slow, by using the single-ended delay elements it is possible to curtail an increase in consumed current. For example, by using 8 differential delay elements and 24 single-ended delay elements, it is possible to have a delay amount center value per any one of the delay elements of 0.2 nS.

Second Exemplary Embodiment

Figure 8:
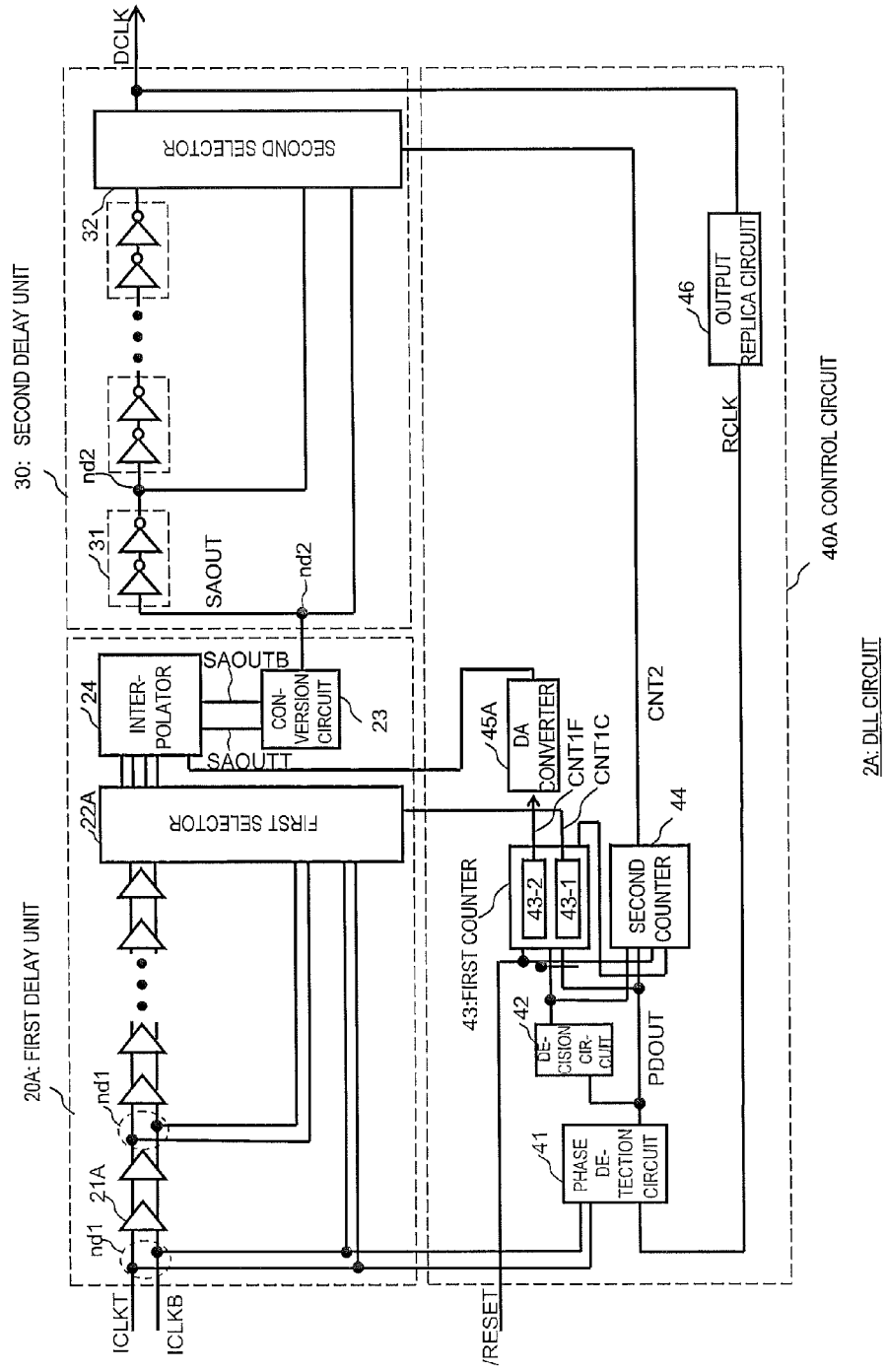
FIG. 8 is a block diagram of a DLL circuit in a second exemplary embodiment.

FIG. 8 is a block diagram showing an internal configuration of a DLL circuit 2A in a semiconductor device of a second exemplary embodiment. Using FIG. 8, a description is given of the internal configuration of the DLL circuit 2A of the second exemplary embodiment. In FIG. 8, parts that are approximately the same as the DLL circuit 2 in the first exemplary embodiment are given the same reference symbols, and repeated descriptions are omitted. In FIG. 8, a first delay element 21A of a first delay unit 20A is not given a bias voltage VBIAS for delay time fine adjustment from a DA converter, and outside of the fact that bias voltage is constant, is the same as the first delay element 21 of the first exemplary embodiment. Therefore, an internal configuration of the first delay element 21A is the same as the first delay element 21 of FIG. 3A, outside of the fact that VBIAS is a constant voltage. A first selector 22A selects and outputs an output of two successive delay elements 21A from among a plurality of cascade-connected first delay elements 21A. Therefore, since 2 signals, a non-inverted output signal and an inverted output signal, are outputted from one of the first delay elements 21A, the first selector 22A outputs a total of 4 output signals. An interpolator 24 takes a weighted average of differential delayed signals outputted from two successive first delay elements 21A, and outputs differential signals SAOUTT and SAOUTB, whose phase is finely adjusted. A DA converter 45A of a control circuit 40A outputs a voltage controlling the interpolator 24. Outside of configurations of the abovementioned first delay elements 21A, the first selector 22A, the interpolator 24, and the DA converter 45A, the remaining configuration is approximately the same as the DLL circuit 2 in the first exemplary embodiment shown in FIG. 2 to FIG. 7, in configuration and in operation.

Figure 9A:
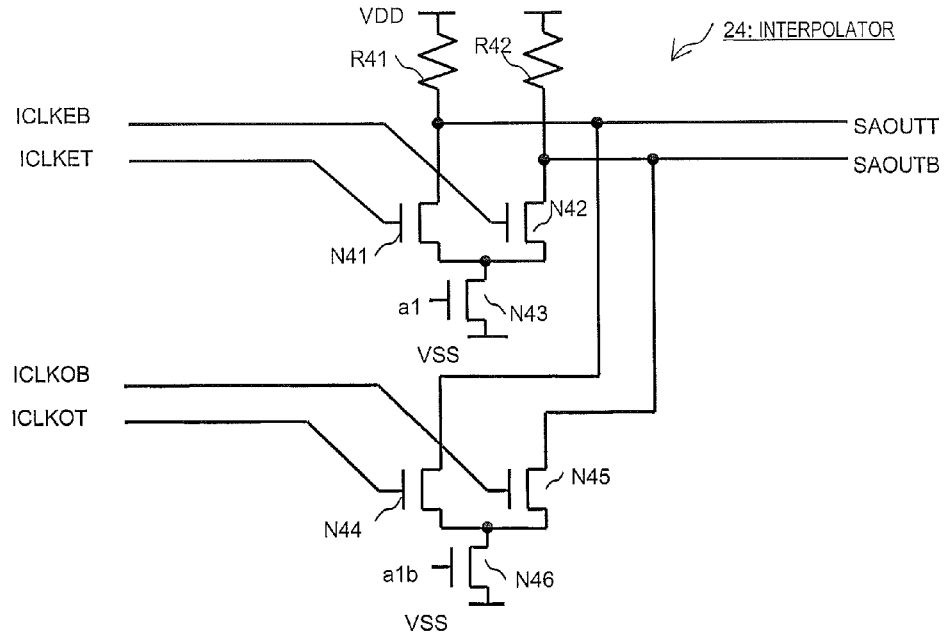
FIG. 9A is a circuit diagram and FIG. 9B is a waveform diagram for an interpolator in the second exemplary embodiment.

FIG. 9A is a circuit diagram showing an example of the configuration of the interpolator 24 in the second exemplary embodiment. A description is given using FIG. 9A concerning an internal configuration of the interpolator 24. The interpolator 24 is provided with a first differential circuit having N channel MOS transistors N41 to N43, and a second differential circuit having N channel MOS transistors N44 to N46.

The first differential circuit is provided with the current source transistor N43 having a source connected to a low potential side power supply VSS and a control voltage signal a1 connected to a gate, and differential pair transistors N41 and N42 having sources commonly connected to a drain of the current source transistor N43, and a first non-inverted differential signal ICLKET and a first inverted differential signal ICLKEB respectively connected to gates thereof. In the same way, the second differential circuit is provided with the current source transistor N46 having a source connected to a low potential side power supply VSS and a control voltage signal a1b connected to a gate, and differential pair transistors N44 and N45 having sources commonly connected to a drain of the current source transistor N46, and a second non-inverted differential signal ICLKOT and a second inverted differential signal ICLKOB respectively connected to gates thereof.

The first non-inverted differential signal ICLKET and the first inverted differential signal ICLKEB, and the second non-inverted differential signal ICLKOT and the second inverted differential signal ICLKOB are respective differential output signals of the first delay element 21A selected by the first selector 22A. Furthermore, among the plurality of cascade-connected first delay elements 21A, a first delay element 21A that outputs the second non-inverted differential signal ICLKOT and the second inverted differential signal ICLKOB is a first delay element 21A connected to a stage after a first delay element 21A that outputs the first non-inverted differential signal ICLKET and the first inverted differential signal ICLKEB.

Furthermore, a drain of the differential pair transistor N41 of the first differential circuit is commonly connected with a drain of the differential pair transistor N44 of the second differential circuit, and is connected with a high potential side power supply VDD via a load resister R41; and in addition a non-inverted output signal SAOUTT of the interpolator 24 is outputted. In the same way, a drain of the differential pair transistor N42 of the first differential circuit is commonly connected with a drain of the differential pair transistor N45 of the second differential circuit, and is connected with a high potential side power supply VDD via a load resister R42; and in addition an inverted output signal SAOUTB of the interpolator 24 is outputted. Furthermore, voltage of the control voltage signal a1 connected to a gate of the power supply transistor N43 of the first differential circuit and the control voltage signal a1b connected to a gate of the power supply transistor N46 of the second differential circuit is controlled by the DA converter 45A, and control is performed to reduce the control voltage signal a1b when the voltage of the control voltage signal a1 is increased, and to increase the control voltage signal a1b when the voltage of the control voltage signal a1 is decreased.

Figure 9B:
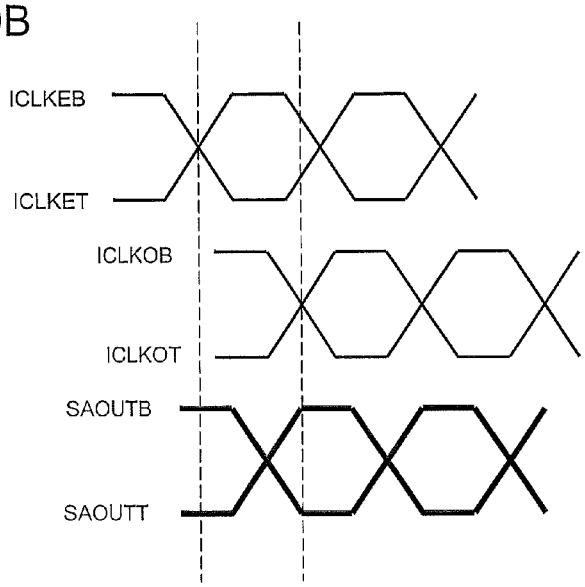

FIG. 9B is a timing chart of an input signal and an output signal of the interpolator 24. In FIG. 9B, with regard to the second non-inverted differential signal ICLKOT and the second inverted differential signal ICLKOB, there is a phase delay of one differential delay element 21A stage compared to the first non-inverted differential signal ICLKET and the first inverted differential signal ICLKEB. The interpolator 24, by controlling voltage of the control voltage signals a1 and a1b, outputs differential signals (SAOUTT and SAOUTB) of phase that is intermediate between the first differential signals (ICLKET and ICLKEB) and the second differential signals (ICLKOT and ICLKOB).

With regard to operation of the second exemplary embodiment, in the first exemplary embodiment fine adjustment of delay time was performed by controlling the bias voltage VBIAS, whereas in the second exemplary embodiment the only change is that this is performed by controlling the voltage of the control voltage signals a1 and a1b supplied to the interpolator, and basic operational flow is the same as in the first exemplary embodiment. Thus, descriptions repeating those of the first exemplary embodiment are omitted.

According to the second exemplary embodiment, in addition to an effect of the first exemplary embodiment, an effect is obtained by which it is possible to more accurately perform fine adjustment of the delay time by the interpolator 24. In particular, in the first exemplary embodiment the range of delay time for which fine adjustment is possible varies according to the number of first delay elements included in the delay path, whereas in the second exemplary embodiment it is always possible to perform fine adjustment of delay time of one differential delay element 21A stage.

Third Exemplary Embodiment

Next, a description is given concerning a semiconductor device provided with a DLL circuit in a third exemplary embodiment. In a configuration of the DLL circuit of the third exemplary embodiment, a decision circuit 42 of the first exemplary embodiment (FIG. 2) or the second exemplary embodiment (FIG. 8) is replaced by a decision circuit 42A of FIG. 10B. Furthermore, in the first exemplary embodiment or the second exemplary embodiment, a rough adjustment counter 43-1 of a first counter was a down-counter, but a rough adjustment counter 43-1 of the third exemplary embodiment is an up/down counter. In addition, in the first exemplary embodiment or the second exemplary embodiment, delay time for one first delay element 21 or 21A was approximately equal to delay time for a second delay element 31, but in the third exemplary embodiment, the delay time for one second delay element 31 can be larger than the delay time for one first delay element 21 or 21A. However, the delay dime for one second delay element is a shorter delay time than the value of total delay time of all the first delay elements 21 or 21A. The configuration of the present exemplary embodiment outside of the above is the same as a DLL circuit of the first exemplary embodiment shown in FIG. 2 or the second exemplary embodiment shown in FIG. 8, and repeated descriptions are omitted.

Figure 10A:
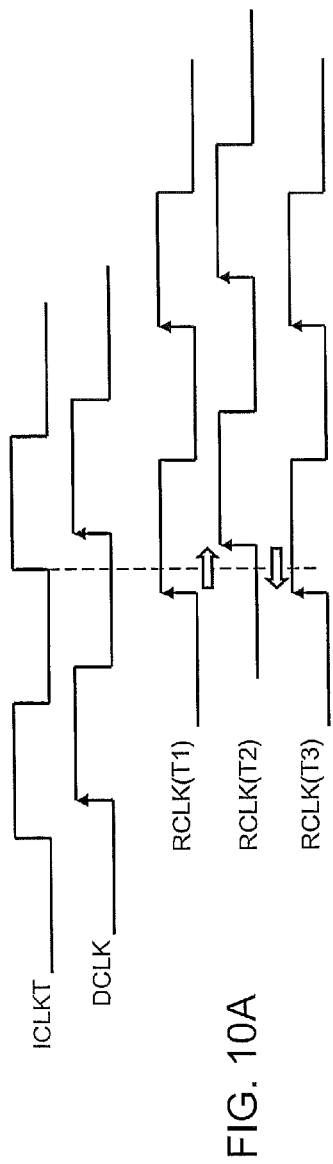
FIG. 10A is a timing chart of a delayed signal in a third exemplary embodiment.
Figure 10B:
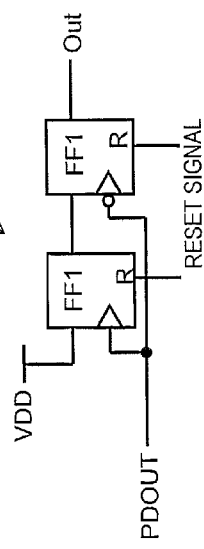
FIG. 10B is a circuit block diagram showing an example of a decision circuit that can be applied to the third exemplary embodiment.

FIG. 10B shows an example of a configuration of the decision circuit 42A of the third exemplary embodiment. The decision circuit 42A of FIG. 10B is further provided with a second data flip-flop FF2 in a later stage of a data flip-flop FF1 of the decision circuit 42 of the first exemplary embodiment shown in FIG. 6B. In the second data flip-flop FF2, a data input terminal is connected to a data output terminal of the data flip-flop FF1, a clock input terminal is connected to an inverted signal that is a phase detection signal PDOUT, being an output signal of a phase detection circuit 41, a reset terminal is connected to a reset signal, and a decision signal OUT is outputted. This decision circuit 42A initializes the decision signal OUT to a low level by the reset signal. After reset release, when the phase detection signal PDOUT goes to a high level and thereafter the phase detection signal PDOUT additionally drops to a low level, the decision signal OUT is at a high level. When the decision signal OUT goes to a high level, the rough adjustment counter 43-1 of a first counter 43 and a second counter 44 stop counting operations, and the rough adjustment is completed.

Figure 10C:
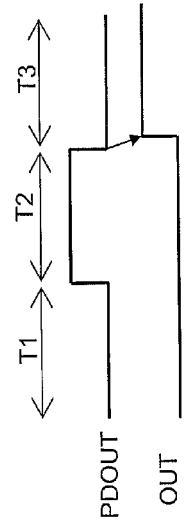
FIG. 10C is a timing chart of a decision circuit.

Next, a description is given concerning operation of the DLL circuit of the third exemplary embodiment, using a flowchart of FIG. 11, timing charts of an internal clock signal ICLKT, a delayed clock signal DCLK, and a feedback clock signal RCLK of FIG. 10A, and timing charts of the phase detection signal PDOUT and the output signal OUT of the decision circuit of FIG. 10C. In the flowchart of FIG. 11, operations of an initial setting S11 and when the phase detection signal PDOUT is at a low level in step S12 are the same as operations in step S12 to step S16 of the first exemplary embodiment described using FIG. 7. Thus, descriptions repeating those of the first exemplary embodiment are omitted. In the third exemplary embodiment, the delay time of the second delay elements 31 may be larger than the delay time of the first delay elements 21, but processing sequence of step S12 to step S16 does not change from the first exemplary embodiment.

By including the first delay elements 21 in step S14 or the second delay elements 31 in step S16 in a delay path, in a case where the phase of the feedback clock RCLK is delayed with respect to the internal clock ICLKT, the phase of the feedback clock RCLK in FIG. 10A transitions from a state of RCLK(T1) to a state of RCLK(T2). Thereupon, the phase detection signal PDOUT outputted by the phase detection circuit 41 rises from a low level to a high level. In the flowchart of FIG. 11, control proceeds from step S12 to step S27. In step S27, a judgment is made as to whether or not a numerical count value of the rough adjustment counter 43-1 is a maximum value. Normally, since step S14 should be passed at least once in proceeding as far as step S27, a numerical count value CNT1C of the rough adjustment counter 43-1 should decrease in comparison to an initial value set in step S11. In a case where all the first delay elements 21 are bypassed, with the numerical count value CNT1C of the rough adjustment counter 43-1 being at the maximum value, since it is not possible to further bypass the first delay elements 21 to perform adjustment advancing the phase of the feedback clock RCLK, control proceeds to step S18, error processing is performed, and processing is ended. For example, this type of state may be envisioned in a case where a clock inputted as an external clock signal CK is a clock signal of fast frequency exceeding an upper limit of a product specification.

In step S27 if the numerical count value CNT1C of the rough adjustment counter 43-1 is not the maximum value, control proceeds to step S28. In step S28, by increasing the numerical count value CNT1C of the rough adjustment counter 43-1 by one and by increasing the number of bypassed first delay elements, the number of first delay elements 21 included in the delay path is decreased, and adjustment is performed to advance the phase of the feedback clock RCLK. That is, in step S14 and step S16 in the timing chart of FIG. 10A, by increasing the delay elements in the delay path, the phase of the feedback clock was delayed so as to go from a state where the phase of the feedback clock RCLK is too advanced RCLK(T1), to a delayed state RCLK(T2), but in step S28 by decreasing the first delay elements included in the delay path, adjustment is made so that the phase of the feedback clock RCLK goes from a delayed state RCLK(T2) to an advanced state RCLK(T3). In the adjustment of delay time in this step S28, since adjustment of the delay time is performed by decreasing the first delay elements, in a case where there is one or more second delay elements in the delay path and the delay time of one of the second delay elements is larger than the delay time of one of the first delay elements, it is possible to perform rough adjustment with the accuracy of the delay time of one of the first delay elements that is shorter than the delay time of one of the second delay elements.

In step S29, the phase of the internal clock ICLK and the feedback clock RCLK are compared in the phase detection circuit 41 once again. Irrespective of the number of first delay elements 21 included in the delay path in step S28 being decreased, in a case where the phase of the feedback clock is still delayed and the phase detection signal PDOUT is at a high level, control returns to step S27. A loop of these steps S27, S28, and S29 continues until a judgment is made as to whether the phase of the feedback clock is still delayed even when all the first delay elements included in the delay path in step S27 are removed, and it is no longer possible to advance the phase of the feedback clock by removing the first delay elements from the delay path, or the phase of the feedback clock has become more advanced than the phase of the internal clock in step S29.

As a result of decreasing the first delay elements 21 included in the delay path in step S28, in the timing chart of FIG. 10A, in a case where the phase of the feedback clock signal transitions from a state RCLK(T2) more delayed than the phase of the internal clock signal ICLKT to an advanced state RCLK(T3), the phase detection circuit 41 once again lowers the phase detection signal PDOUT to a low level. Thereupon, as shown in the timing chart of FIG. 10C, the decision circuit 42A raises the decision signal OUT from a low level to a high level, the rough adjustment counter 43-1 and the second counter stop count operations, the DLL circuit 2 is in a locked state, and the rough adjustment is completed. Furthermore, in the flow chart of FIG. 11, control proceeds to step S17, and the rough adjustment is completed.

Thereafter, in a case where further fine adjustment is necessary, similar to the first exemplary embodiment, by the numerical count value CNT1F of the fine adjustment counter 43-2 of the first counter 43 counting up or counting down, it is possible to perform fine adjustment.

In the third exemplary embodiment, when the frequency of the external clock is fast, a high accuracy clock is outputted without being affected by noise, and when the frequency of the external clock is relatively slow, by using single-ended delay elements, an effect of being able to curtail an increase in the consumed current is obtained, as in an effect of the first exemplary embodiment. Furthermore, even in a case where the delay time for one of the single-ended delay elements (second delay elements) is longer than the delay time for one of differential delay elements (first delay elements), it is possible to perform rough adjustment of the delay time in units of the delay time for one of the differential delay elements, by steps S27, S28, and S29. Therefore, if change of frequency of the external clock CK or change of a delay time characteristic of the differential delay elements or the single-ended delay elements is not considered, with regard to fine adjustment it is sufficient to be able to adjust the delay time amount of one of the differential delay elements, and it is not a problem even if the delay time for one of the single-end delay elements is a longer time than this. That is, it is possible to provide a DLL circuit in which synchronization is possible in a wider frequency range.

Fourth Exemplary Embodiment

In a configuration of a fourth exemplary embodiment, with respect to the third exemplary embodiment it is sufficient if a rough adjustment counter 43-1 has a down-count function, and outside of the fact that an up-count function is not necessary and delay times for one first delay element 21 and one second delay element 31 are approximately equal, the configuration is the same as that of the third exemplary embodiment. Furthermore, a fine adjustment counter 43-2 requires at least an up-counter function. Outside of this the configuration is the same as for the third exemplary embodiment, and repeated descriptions are omitted.

Figure 12:
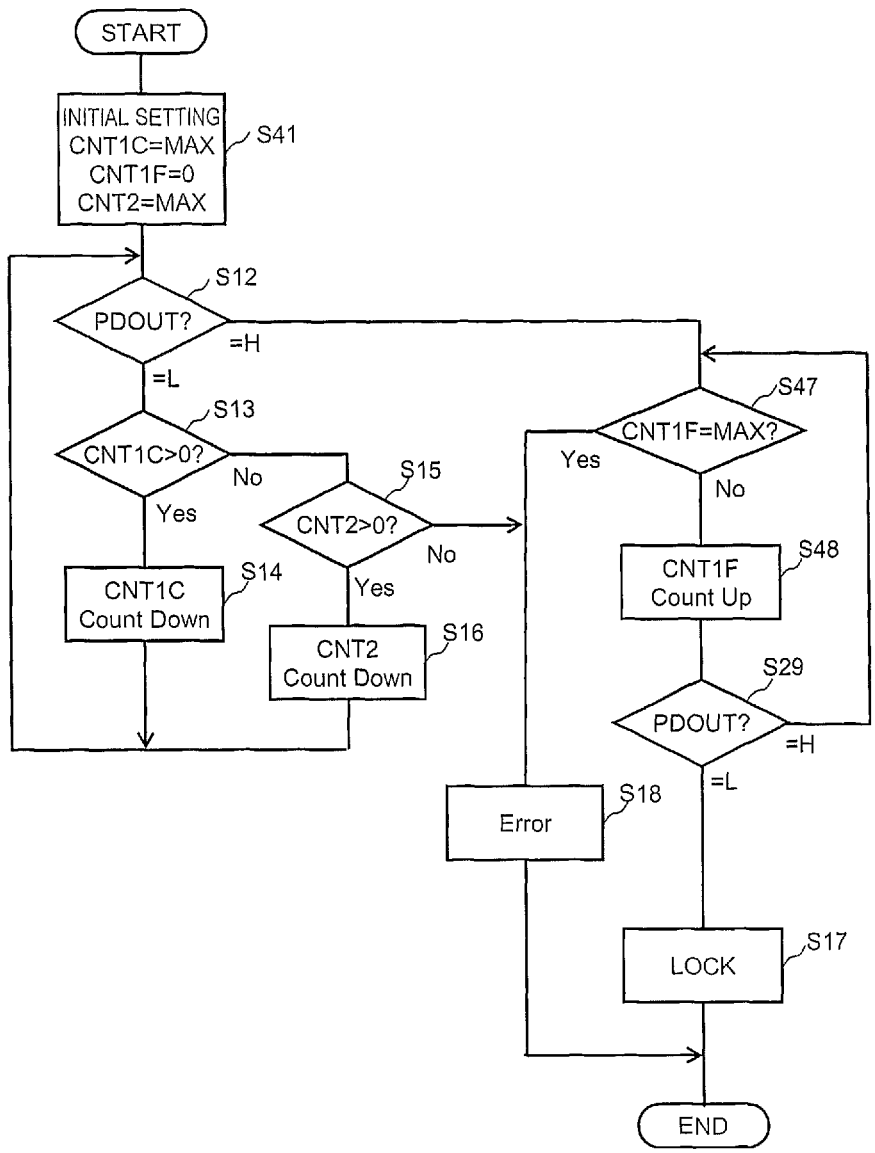
FIG. 12 is a flow chart showing a delay amount control method (in a case where delay amounts of first delay elements and second delay elements are approximately the same and fine adjustment is performed) according to a fourth exemplary embodiment.

FIG. 12 is a process flow chart of the fourth exemplary embodiment. In step S41, in addition to setting numerical count values of the rough adjustment counter 43-1 and the second counter to maximum values, a numerical count value CNT1F of the fine adjustment counter 43-2 is set to a minimum value 0. If the numerical count value CNT1F of the fine adjustment counter 43-2 is set to a minimum value 0, delay time of first delay elements, which are differential delay elements, is set to a maximum delay time in a delay time range in which fine adjustment is possible. In addition, in a case of using an interpolator of the second exemplary embodiment for the fine adjustment, if the numerical count value CNT1F of the fine adjustment counter 43-2 is set to a minimum value 0, delay time is set to a maximum delay time in a range in which fine adjustment is possible.

In FIG. 12, processing of steps S12 to S16 is the same as for the first exemplary embodiment and the third exemplary embodiment, and repeated descriptions are omitted. In step S12, when a phase detection signal PDOUT goes to a high level, control proceeds to step S47. In step S27 a check is made as to whether or not the numerical count value CNT1F of the fine adjustment counter 43-2 has reached the maximum value. Since an initial setting value of the fine adjustment counter 43-2 is 0, when control proceeds to step S47 initially, CNT1F=MAX does not hold. Therefore, control proceeds to step S48 and the numerical count value CNT1F of the fine adjustment counter 43-2 counts up by one. If the numerical count value CNT1F of the fine adjustment counter 43-2 increases, accompanying this the delay time of the first delay elements decreases. Therefore, in FIG. 10A, the phase of a delayed feedback clock RCLK undergoes fine adjustment from a state of RCLK(T2) to a state of RCLK(T3). In step S29, as a result of the fine adjustment of the phase of RCLK, in a case where the phase of the feedback clock RCLK is more advanced than an internal clock ICLKT, the fine adjustment is completed, control proceeds to step S17, and the state of a DLL circuit is locked. In a case where the fine adjustment is insufficient, control returns to step S47, and a loop of step S47, step S48, and step S29 is repeated until the fine adjustment is completed. When the numerical count value CNT1F of the fine adjustment counter 43-2 reaches the maximum value in step S47, since it is not possible to shorten delay time on a delay path by fine adjustment beyond this, processing moves to error processing of step S18, and the processing is completed.

In the fourth exemplary embodiment, when the frequency of an external clock is fast, a high accuracy clock is outputted without being affected by noise, and when the frequency of the external clock is relatively slow, by using single-ended delay elements an effect of being able to curtail an increase of the consumed current is obtained in this way, which are effects of the first exemplary embodiment. Furthermore, locking can be implemented after performing the fine adjustment. In the fourth exemplary embodiment, it is possible to use either a method of fine adjustment of delay time of the first exemplary embodiment, or a method of fine adjustment of delay time using an interpolator 24 of the second exemplary embodiment.

Fifth Exemplary Embodiment

Next, a description is given concerning a fifth exemplary embodiment. A configuration of a DLL circuit of the fifth exemplary embodiment is approximately the same as a configuration of a DLL circuit of the fourth exemplary embodiment. However, the fifth exemplary embodiment uses a decision circuit (omitted from the drawings), whereby a decision circuit 42 of FIG. 6B is additionally connected in a stage after a decision circuit 42A of FIG. 10B. A phase detection signal PDOUT goes to a low level in an initial stage, transitions to a high level, low level, and high level, and when it goes to a high level a second time, a decision signal OUT is outputted at a high level by this decision circuit. In addition, the delay time of second delay elements 31, which are single-ended delay elements, similar to the third exemplary embodiment, need not be the same as first delay elements 21 or 21A, which are differential delay elements, and if the delay time of one of the second delay elements is shorter than a total delay time of plural cascade-connected first delay elements 21, the delay time for one of the second delay elements may be larger than the delay time for one of the first delay elements. The remaining configuration is the same as a configuration of a DLL circuit of the fourth exemplary embodiment.

Figure 13:
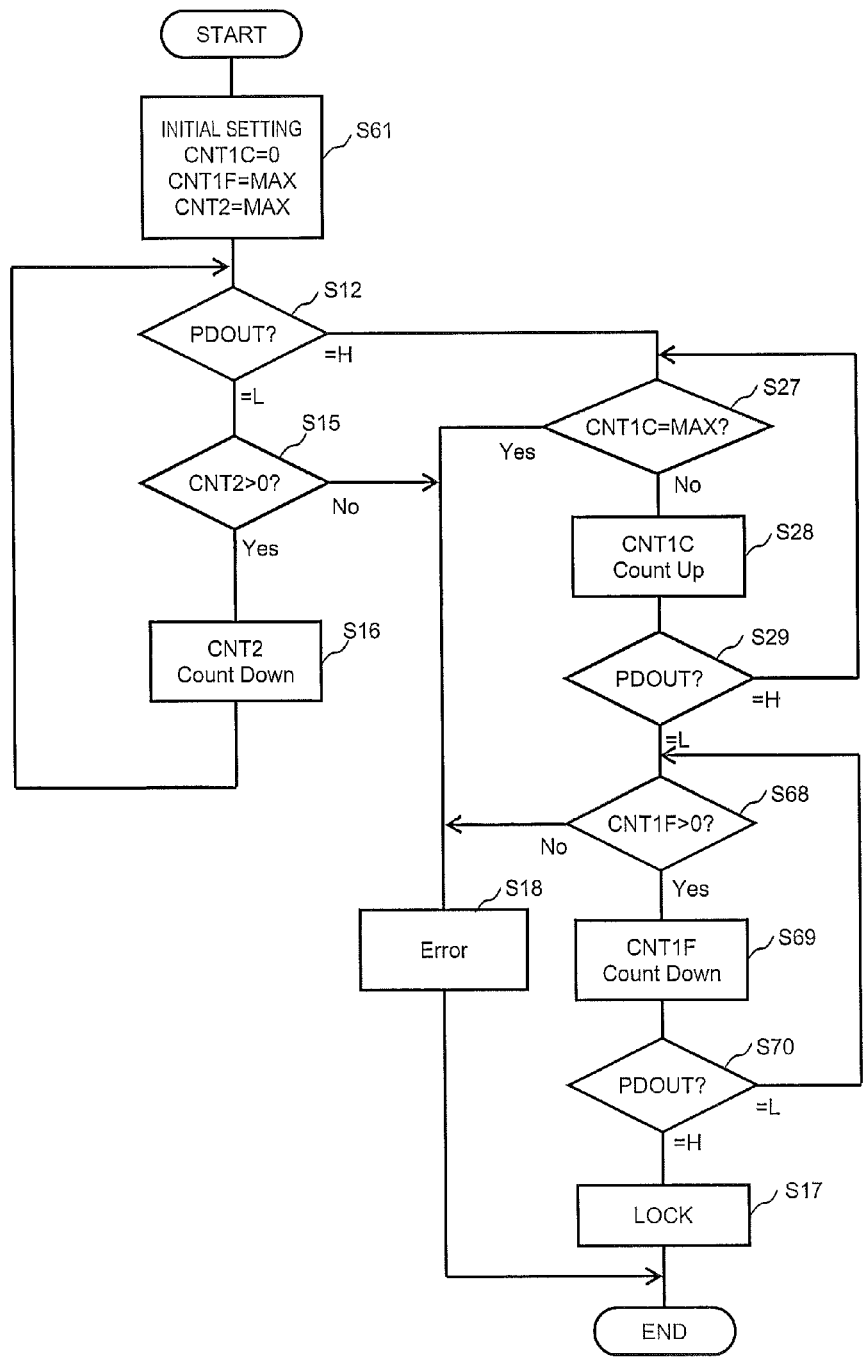
FIG. 13 is a flow chart showing a delay amount control method (in a case where a delay amount of second delay elements is larger than a delay amount of first delay elements, and fine adjustment is performed) according to a fifth exemplary embodiment.

Next, a description is given concerning operation of the fifth exemplary embodiment, using a process flowchart of FIG. 13. In an initial setting in step S61, an initial setting of a first counter is different from the first to fourth exemplary embodiments. In the fifth exemplary embodiment, a numerical count value of a rough adjustment counter 43-1 is initially set to 0. That is, in the first to fourth exemplary embodiments, in an initial setting, the numerical count value of the rough adjustment counter 43-1 was set to a maximum value, and in the initial setting the first delay elements were all bypassed, whereas in the fifth exemplary embodiment, in an initial setting, the first delay elements 21 (or 21A) are all included in a delay path. Furthermore, an initial setting value of the fine adjustment counter 43-2 is set to a maximum value, and a setting is made to a shortest delay time for which fine adjustment is possible. An initial setting of a numerical count value CNT2 of a second counter is the same as in the first to fourth exemplary embodiments, being set to a maximum value, and in the initial setting all of the second delay elements are bypassed.

That is, in the fifth exemplary embodiment, in the initial setting the first delay elements 21 are all included in the delay path, and the second delay elements 31 are all bypassed. Furthermore, fine adjustment of the delay time of the first delay elements 21 is initially set to a state in which the delay time is shortest.

After the initial setting in step S61, in step S12, the phase of a feedback clock signal RCLK is compared with the phase of an internal clock signal ICLKT. If the phase of the feedback clock signal RCLK is more advanced than the phase of the internal clock signal ICLKT, control proceeds to step S15 and step S16, and the second delay elements 31 are added one by one to the delay path until the phase of the feedback clock signal RCLK is more delayed than the phase of the internal clock signal ICLKT. When there are no longer any second delay elements 31 to be added in step S15, since it is not possible to increase the delay amount of the delay path beyond this, control proceeds to step S18, error processing is performed, and processing is finished. A case where the frequency of an external clock CK is a frequency lower than specification is applicable.

On the other hand, in step S12 if the phase of the feedback clock signal RCLK is more delayed than an internal clock signal ICLKT, control proceeds to step S27. In step S27, a check is made as to whether or not a numerical count value of the rough adjustment counter 43-1 is a maximum value. When the numerical count value of the rough adjustment counter 43-1 is at a maximum, since it is not possible to increase the delay elements 21 beyond this, control proceeds to step S18, error processing is performed, and processing is finished. When the numerical count value of the rough adjustment counter 43-1 is not at a maximum, control proceeds to step S18, and by increasing the numerical count value of the rough adjustment counter 43-1 by one and bypassing one of the first delay elements, adjustment is performed so that the phase of the feedback clock signal RCLK is advanced. In step S29, a check is made as to whether or not the phase of the feedback clock signal RCLK is more advanced than the phase of the internal clock signal ICLKT. In a case where the phase of the feedback clock signal RCLK is still delayed, control returns to step S27, and a loop of steps S27, S28, and S29 is repeated until the phase of the feedback clock signal RCLK is more advanced than the phase of the internal clock signal ICLKT.

In step S29, in a case where the phase of the feedback clock signal RCLK is more advanced than the phase of the internal clock signal ICLKT, rough adjustment is finished, control proceeds to step S68, and fine adjustment is started. In step S68, a check is made as to whether or not the numerical count value CNT1F of the fine adjustment counter 43-2 is 0. If the numerical count value CNT1F of the fine adjustment counter 43-2 is 0, since it is not possible to perform adjustment to delay the delay time beyond this by fine adjustment, control proceeds to step S18, error processing is performed, and processing is finished. If the numerical count value CNT1F of the fine adjustment counter 43-2 is not 0, control proceeds to step S69, the numerical count value CNT1F of the fine adjustment counter 43-2 is counted down by one, and fine adjustment is performed in a direction that increases the delay time. In addition, in a case where control proceeds to step S70 and the phase of the feedback clock signal RCLK is behind the phase of the internal clock signal ICLKT, as completion of the fine adjustment a decision signal OUT goes to a high level, numerical counts of the first and second counters are finished, control proceeds to step S17, and the entire DLL circuit is locked. In a case where the phase of the feedback clock signal RCLK is still more advanced than the phase of the internal clock signal ICLKT, control returns to step S68, and loop processing of steps S68, S69, and S70 is repeated until the phase of the feedback clock signal RCLK becomes more delayed than the phase of the internal clock signal ICLKT.

According to the fifth exemplary embodiment, when the frequency of a reference clock (external clock) is high, similar to the first to fourth exemplary embodiments, since it is possible to configure a delay path using differential delay elements without using single-ended delay elements, it is possible to output a high accuracy clock without being affected by noise.

Furthermore, according to the fifth exemplary embodiment, when the frequency of the reference clock (external clock) is relatively low, by using single-ended delay elements, it is possible to curtail an increase in consumed current. In addition, when the frequency of the reference clock (external clock) is relatively low, approximate delay time adjustment is carried out using single-ended delay elements with delay time being large initially, then adjustment of the delay time with intermediate level accuracy is carried out using good accuracy differential delay elements with short delay time, and finally fine adjustment of the delay time is carried out using the differential delay elements (or using an interpolator). By carrying out the adjustment of the delay time in 3 stages, it is possible to perform adjustment of delay time with high accuracy in a wide frequency range.

Sixth Exemplary Embodiment

Figure 14:
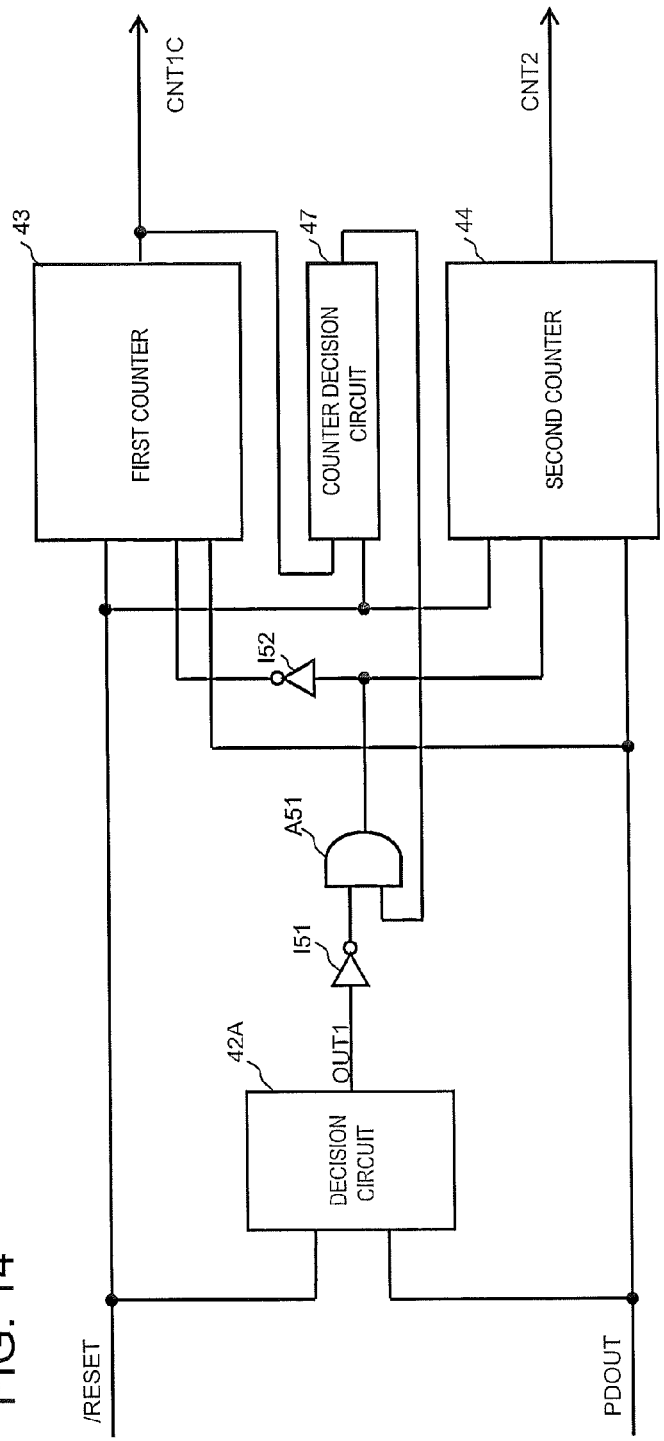
FIG. 14 is a circuit block diagram of control circuit main parts of a DLL circuit in a sixth exemplary embodiment.

FIG. 14 is a circuit diagram of a control circuit (main parts) in a sixth exemplary embodiment. Configuration of the control circuit 40B outside of the main parts described in FIG. 14 is the same as a control circuit 40 described in FIG. 2. Furthermore, configuration of a first delay unit 20 and a second delay unit 30, outside of the control circuit 40B, is the same as a configuration of a DLL circuit 2 of the first exemplary embodiment described in FIG. 2.

The control circuit 40B is provided with a counter decision circuit 47 that decides whether or not a numerical count value of a first counter 43 (rough adjustment counter 43-1) has reached a prescribed value, an inverter circuit I51 that inverts a decision signal OUT1, which is an output signal of a decision circuit 42A, a logical AND circuit A51 that receives an output signal of the counter decision circuit 47 and an output signal of the inverter I51, and an inverter circuit I52 that inverts output of the logical AND circuit A51 and controls a count of the first counter. In addition, an output signal of the logical AND circuit A51 is connected to a second counter 44 and controls a count of the second counter.

Furthermore, in the control circuit 40B of FIG. 14, when a /RESET signal becomes active at a time of an initial setting, a first decision signal OUT1 of the decision circuit 42A is initially set to a low level, a numerical count value of the first counter 43 (rough adjustment counter 43-1) is initially set to a maximum value, and an output signal of the counter decision circuit 47 is initially set to a low level.

First, corresponding to a low level of a phase detection signal PDOUT when decision making is started, the first decision signal OUT1 of the decision circuit 42A goes to a low level. Furthermore, since an output signal of the counter decision circuit 47 is set to a low level by an initial setting, an output signal of the logical AND circuit A51 is at a low level, the first counter 43 is active, the second counter is non-active, a count-down of the first counter 43 (the rough adjustment counter 43-1) proceeds, and the second counter 44 is non-active. Here, the first decision signal OUT1 of the decision circuit 42A is a signal outputted at a low level corresponding to a low level of the phase detection signal PDOUT, going to a high level in correspondence with a high level of the phase detection signal PDOUT.

The counter decision circuit 47 is configured to output at a high level when at a prescribed intermediate count value of all count values of the first counter 43, and when a count-down of the first counter 43 reaches the prescribed intermediate count value, the numerical count of the first counter 43 is made non-active, and the count of the second counter is made active.

Continuing, in a case where the phase detection signal PDOUT is at a low level, a count-down of the second counter 44 proceeds. Thereafter, when the phase detection signal PDOUT changes from a high level to low level to high level, and the decision circuit 42A detects a locked state, the first decision signal OUT1 has a high level. The first counter is then activated once again, and the second counter is non-active. Thereafter, only the first counter 43 operates, in response to a value of the phase detection signal PDOUT.

According to the sixth exemplary embodiment, in addition to an effect of the first exemplary embodiment, it is necessary to use single-ended delay elements initially, and in a case of using the single-ended delay elements, by initially setting the number of single-ended delay elements necessary in a delay path and thereafter increasing or decreasing the number of differential delay elements necessary in the delay path, it is possible to perform accurate adjustment. Furthermore, the sixth exemplary embodiment can be implemented in combination with an exemplary embodiment of any of the first to fifth exemplary embodiments, so that an effect is obtained that is combined with specific effects of the respective exemplary embodiments.

Seventh Exemplary Embodiment

Figure 15:
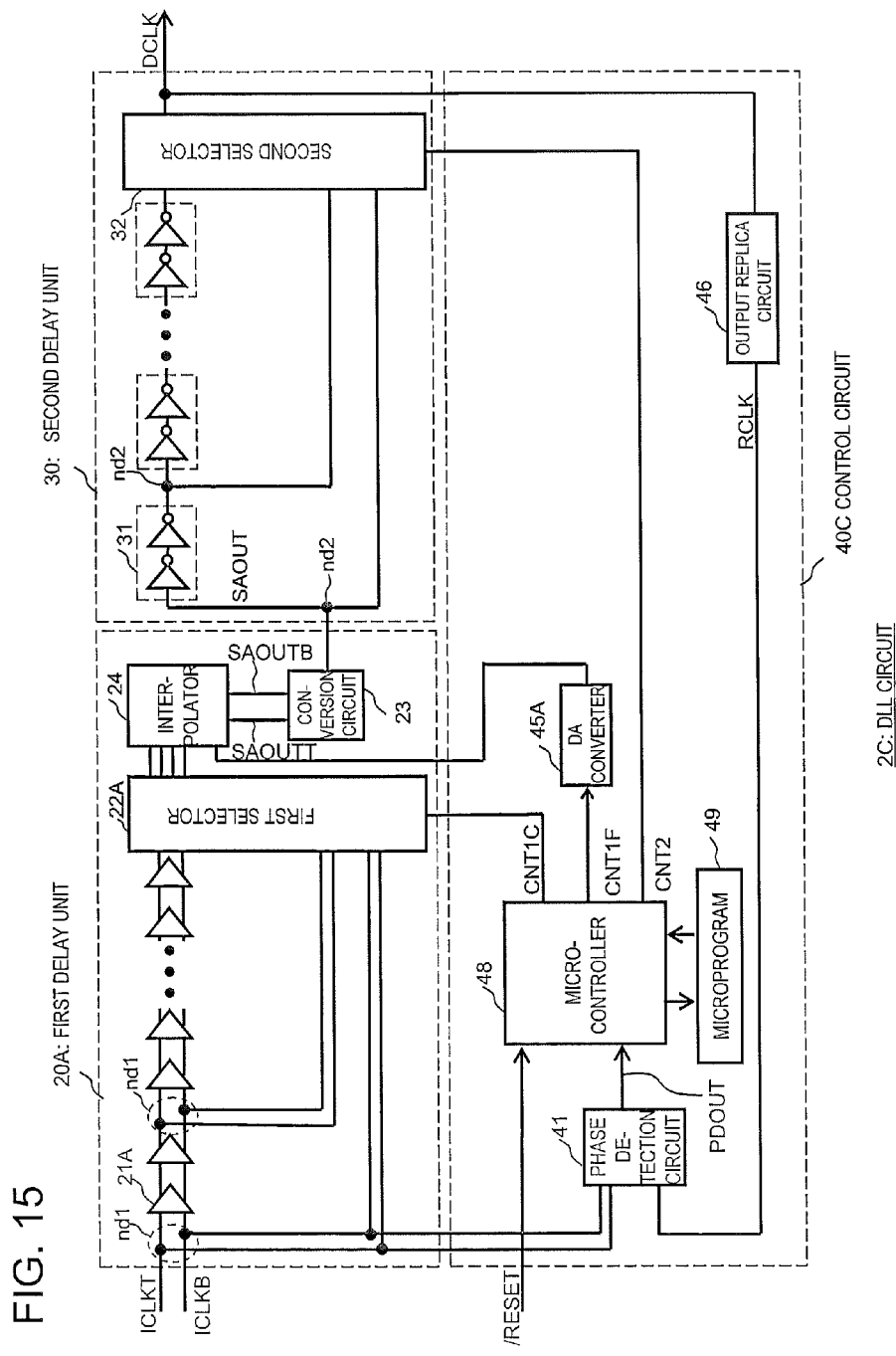
FIG. 15 is a block diagram of a DLL circuit in a seventh exemplary embodiment.

FIG. 15 is a block diagram of a DLL circuit in a seventh exemplary embodiment. In a DLL circuit 2C of the seventh exemplary embodiment shown in FIG. 15, a decision circuit 42, a first counter 43, and a second counter 44 of a DLL circuit 2A of the second exemplary embodiment shown in FIG. 8 are replaced by a microcontroller 48 and a microprogram 49. The configuration otherwise is the same as a configuration of the DLL circuit 2A of the second exemplary embodiment shown in FIG. 8.

The microcontroller 48 of FIG. 15 outputs a control signal CNT1C controlling a first selector 22A, a control signal CNT2 controlling a second selector 32, and a control signal CNT1F controlling a DA converter 45A, according to a /RESET signal, a phase detection signal POUT outputted by a phase detection circuit 41, and microcode read from the microprogram 49. Furthermore, the microcontroller 48 outputs an address signal indicating an address of the microprogram 49 to be executed next, to the microprogram 49. The microprogram 49 can be stored in non-volatile memory such as ROM, flash memory, or the like, or volatile memory such as RAM or the like. In a case where the microprogram 49 is stored in re-writable memory such as flash memory or RAM, it can be installed in re-writable memory of a semiconductor device via computer program storage media such as a hard disk or the like.

Furthermore, since the microcontroller 48 can execute respective processes described in FIG. 7, FIG. 11, FIG. 12, and FIG. 13, in accordance with the microprogram 49, it is possible to execute any control operations of the abovementioned first to sixth exemplary embodiments. Therefore, by replacing a control circuit of the first exemplary embodiment to the sixth exemplary embodiment by a control circuit 40C of the seventh exemplary embodiment, respective effects of the first exemplary embodiment to the sixth exemplary embodiment are obtained. In addition, by changing the microprogram 49, it is possible to perform more complicated control. It is to be noted that the abovementioned microprogram 49 is a computer program, and the microcontroller 48 can be viewed as a computer that controls delay amount of a delay circuit by executing the microprogram 49 as a computer program.

It is to be noted that preferred exemplary embodiments of the present invention have been described, but the present invention is not limited to the abovementioned exemplary embodiments, and various modifications are possible. In FIG. 2, FIG. 8, and FIG. 15, a first selector is provided in a final stage of cascade-connected first delay elements and a second selector is provided in a final stage of cascade-connected second delay elements, but a selection switch that selects whether or not respective delay elements in each of the cascade-connected first delay elements and second delay elements are to be included in a delay path may be provided for each delay element.

Furthermore, a description has been given concerning a delay circuit used in the DLL circuit of a synchronous memory as a preferable exemplary embodiment, but a delay circuit of a semiconductor device of the present invention can be applied to a semiconductor device provided with a DLL circuit outside of a synchronous memory or a variable delay circuit not limited to a narrowly-defined DLL circuit.

Variations of various types of mode of the present invention described above are possible, and several preferable modes thereof are recited below.

(Mode 1)
A semiconductor device comprising
  a delay circuit that comprises:
  a first delay unit that includes a plurality of differential first delay elements which are respectively connected in series,
  a plurality pairs of first contacts which are respectively provided between the plurality of first delay elements, and
  a first output circuit that outputs a first delayed signal corresponding to a pair of first contacts selected from among the plurality pairs of first contacts on receiving a first selection signal; and
  a second delay unit that receives the first delayed signal, and that includes
  a plurality of single-ended second delay elements which are respectively connected in series,
  a plurality of second contacts which are respectively provided between the plurality of second delay elements, and
  a second output circuit that outputs a second delayed signal corresponding to a second contact selected from among the plurality of second contacts on receiving a second selection signal; and comprising:
  a control circuit that outputs each of the first and second selection signals.

(Mode 2)
The semiconductor device according to mode 1 wherein
  the first delay unit receives and delays a pair of differential clock signals to generate the first delayed signal, and
  the control circuit comprises a phase detection circuit that detects phase difference of the pair of differential clock signals and the second delayed signal, and based on a detection result of the phase detection circuit, outputs each of the first and second selection signals.

(Mode 3)
The semiconductor device according to mode 2 wherein
the control circuit comprises a first counter and a second counter that count based on a detection result of the phase detection circuit,
the first output circuit is provided with a first selector that selects the pair of first contacts selected among the plurality pairs of first contacts according to a numerical count value of the first counter, and
the second output circuit is provided with a second selector that selects the contact selected among the plurality of second contacts according to a numerical count value of the second counter.

(Mode 4)
The semiconductor device according to mode 3 wherein the control circuit is further provided with a decision circuit that finishes count operations of the first counter and the second counter, based on a history of detection results of the phase detection circuit.

(Mode 5)
The semiconductor device according to any one of Modes 2 to 4 is further provided with a synchronization circuit that operates in synchronization with the pair of differential clock signals, wherein the second delay signal is supplied as a clock signal whose phase is adjusted, to the synchronization circuit.

(Mode 6)
The semiconductor device according to any one of Modes 2 to 5 wherein the phase detection circuit is provided with:
a current source circuit in which conductivity and non-conductivity are controlled by a single-ended third delayed signal obtained by further delaying the second delayed signal,
a differential pair commonly connected to the current source circuit and including a pair of input terminals connected to an inverted input signal and a non-inverted input signal of the pair of differential clock signal,
a first inverter circuit connected between a power supply and a first output terminal of the differential pair, and
a second inverter circuit connected between the power supply and a second output terminal of the differential pair, including an input terminal connected to an output terminal of the first inverter circuit, and an output terminal connected to the input terminal of the first inverter circuit,
wherein a signal based on a phase difference of the third delayed signal and the pair of differential clock signals is outputted from the first inverter circuit and/or the second inverter circuit.

(Mode 7)
The semiconductor device according to any one of Modes 1 to 6 wherein each of the plurality of first delay elements is a delay element of differential input and differential output type, which receives a pair of differential signals, amplifies a potential difference between the pair of differential signals, and outputs a pair of differential signals that are delayed; and each of the plurality of second delay elements is a delay element of single-ended input and single-ended output type, which receives a single-ended signal, determines a logic level of the single-ended signal, and outputs a delayed single-ended signal.

(Mode 8)
The semiconductor device according to any one of Modes 1 to 7, wherein
each of the plurality of first delay elements is a differential delay element that is provided with:
a current source circuit;
a first differential transistor having a source connected to the current source circuit, a gate connected to a non-inverted signal input terminal, and a drain connected to an inverted signal output terminal,
a second differential transistor having a source connected in common with the source of the first differential transistor to the current source circuit, a gate connected to an inverted signal input terminal, and a drain connected to a non-inverted signal output terminal,
a first load circuit connected to the drain of the first differential transistor, and
a second load circuit connected to the drain of the second differential transistor; and,
each of the plurality of the second delay elements is a delay element including a CMOS inverter delay element that is provided with
a first conductive transistor having a source connected to a first power supply, and
a second conductive transistor having a source connected to a second power supply, a gate connected in common with a gate of the first conductive transistor to an input terminal, and a drain connected in common with a drain of the first conductive transistor to an output terminal, and being of reverse conductivity to the first conductive transistor.

(Mode 9)
The semiconductor device according to any one of Modes 1 to 8, wherein
the first output circuit is further provided with a differential to single-ended conversion circuit that converts a differential signal to a single-ended signal, the differential to single-ended conversion circuit is provided with
a pair of transistors that have input terminals to which a differential pair of first delayed signals is respectively connected, and that is commonly connected to a power supply,
a first current mirror circuit that makes flow from a third contact a current proportional to a current flowing in a current path of one transistor among the pair of transistors,
a second current mirror circuit that makes flow to the third contact a current proportional to a current flowing in a current path of the other transistor among the pair of transistors, and
a single-ended signal output circuit that outputs a signal in response to a voltage at the third contact as a first delayed signal that is single-ended.

(Mode 10)
The semiconductor device according to any one of Modes 1 to 9, wherein the first delay unit is further provided with a fine adjustment circuit that performs fine adjustment of delay time.

(Mode 11)
The semiconductor device according to any one of Modes 1 to 10, wherein, among the plurality of first delay elements, at least a portion of the first delay elements is configured such that fine adjustment of delay time is possible by controlling bias voltage of a current source transistor.

(Mode 12)
The semiconductor device according to any one of Modes 1 to 10, wherein the first delay unit is further provided with an interpolator that receives a first pair of differential signals and a second pair of differential signals whose phase are delayed compared to the first differential signals, and that takes a weighted average of the first pair of differential signals and the second pair of differential signals and outputs a pair of differential signals on which fine adjustment of phase thereof have been performed.

(Mode 13)
The semiconductor device according to mode 12, wherein the interpolator is provided with first and second differential circuits each having a current source in which current value can be controlled, wherein
the first and second differential signals are respectively connected as differential input signals to the first and second differential circuits,
non-inverted output terminals of the first and second differential circuits are respectively connected to non-inverted output terminals of the interpolator,
inverted output terminals of the first and second differential circuits are respectively connected to inverted output terminals of the interpolator, and
fine adjustment of the phase is possible according to a first value of current flowing in the current source of the first differential circuit and a second value of current flowing in the current source of the second differential circuit.

(Mode 14)
A semiconductor device comprising:
a delay circuit that delays a pair of input signals and outputs a delayed signal, and
a control circuit that controls delay time of the delay circuit; wherein said delay circuit comprises:
a first delay unit that receives a pair of differential signals and includes a plurality of cascade-connected first delay elements that output a pair of differential signals, and
a second delay unit that receives a single-ended signal, includes a plurality of cascade-connected second delay elements that output a single-ended signal, and is connected in series with said first delay unit; and wherein said control circuit,
in a case where a desired delay time is obtained with a delay time of the first delay unit, bypasses each delay element of the second delay unit, and also controls delay time by controlling the number of delay elements that are bypassed, among said plurality of cascade-connected first delay elements, and
in a case where a desired delay time is not obtained with a delay time of the first delay unit, controls delay time of said second delay unit by controlling the number of delay elements that are bypassed, among said plurality of cascade-connected second delay elements, and by adding the delay time of the second delay unit to the delay time of said first delay unit, controls overall delay time.

(Mode 15)
The semiconductor device according to mode 14 wherein it is possible to perform fine adjustment of delay time of at least a portion of said first delay elements among the plurality of cascade-connected first delay elements, and wherein said control circuit performs fine adjustment of delay time of a first delay element on which said fine adjustment can be performed, after performing rough adjustment by controlling the number of bypassed delay elements.

(Mode 16)
The semiconductor device according to mode 14 or 15, wherein said pair of input signals are a pair of differential signals and said delayed signal is a single-ended signal, and said first delay unit comprises a differential to single-ended conversion circuit that converts a pair of differential output signals to a single-ended signal and outputs to the second delay unit.

(Mode 17)
The semiconductor device according to any one of modes 1 to 16 further comprising a data output circuit, wherein a delayed signal outputted by said delay circuit is a signal such that a data output signal outputted from said data output circuit is made synchronous with a non-inverted clock signal and an inverted clock signal supplied from outside as a pair of differential signals to the first delay unit.

(Mode 18)
The semiconductor device according to mode 17 further comprising a synchronous semiconductor memory device, wherein said data output signal is a data output signal read from the synchronous semiconductor memory device.

(Mode 19)
A delay amount control method for a delay circuit including a first delay unit provided with a plurality of differential first delay elements and in which a delay amount is adjusted in correspondence with a first selection signal, and a second delay unit provided with a plurality of single-ended second delay elements and in which a delay amount is adjusted in correspondence with a second selection signal, the method comprising: controlling the first selection signal and adjusting a delay amount in the first delay unit without adjusting a delay amount in the second delay unit, and controlling the second selection signal and adjusting the delay amount in the second delay unit after said adjustment of the first delay unit.

(Mode 20)
The delay amount control method according to mode 19, in a case where a delay amount of the delay circuit to be adjusted is obtained by using the plurality of first delay elements, a delay amount is adjusted without using the second delay elements, and in a case where the delay amount to be adjusted is insufficient with only the plurality of first delay elements, the second delay elements are used and the delay amount of the second delay unit is added to the delay amount of the first delay unit to adjust the delay amount of the delay circuit.

(Mode 21)
The delay amount control method according to mode 19 or 20, the delay amount of the second delay unit is initially set to a minimum delay amount; after the initial setting, a delay amount of a first control unit is adjusted by using the first selection signal, and in a case where the delay amount of the delay circuit is adjusted to a desired delay amount, adjustment is finished without changing the delay amount of the second delay unit from a state of the initial setting; and in a case where even when the delay amount of the first control unit is adjusted to the maximum, the delay amount of the delay circuit does not satisfy a desired delay amount, the second selection signal is used to carry out adjustment of the second delay unit.

(Mode 22)
The delay amount control method according to mode 21 includes making an initial setting of the delay amount of the first delay unit to a minimum delay amount, in the initial setting, with the delay amount of the delay circuit being a delay amount of a delay path, using the first selection signal to add the first delay elements to the delay path one by one, until the delay amount of the delay path reaches a desired delay amount, in an adjustment of the delay amount of the first control unit, and in a case where even when all of the plurality of first delay elements are added to the delay path, the delay amount of the delay path does not satisfy a desired delay amount, additionally adding the second delay elements one by one to the delay path, using the second selection signal, until the delay amount of the delay path reaches the desired delay amount.

(Mode 23)
The delay amount control method according to mode 21 includes making an initial setting of the delay amount of the first delay unit to a minimum delay amount, in the initial setting, with the delay amount of the delay circuit being a delay amount of a delay path, using the first selection signal to add the first delay elements to the delay path one by one, until the delay amount of the delay path reaches a desired delay amount, in an adjustment of the delay amount of the first control unit; in a case where even when half the first delay elements are added to the delay path, among the plurality of first delay elements, the delay amount of the delay path does not satisfy a desired delay amount, additionally adding the second delay elements one by one to the delay path, using the second selection signal, until the delay amount of the delay path reaches a desired delay amount, and in addition using the first control signal to adjust the number of first delay elements included in the delay path, after adding the second delay elements.

(Mode 24)

A computer program executes on a computer the delay amount control method for a delay circuit according to any one of modes 19 to 23.

(Mode 25)

A computer readable storage medium records the computer program according to mode 24.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A method for synchronizing an output clock signal with an input clock signal in a delay locked loop having a multi-element single-ended delay line, a multi-element differential delay line, and an interpolator that receives outputs of first and second elements of the differential delay line, the single-ended delay line, the differential delay line, and the interpolator being arranged such that the input clock passes through all three to provide the output clock signal, the method comprising:
    initializing:
        a first count value to bypass a first plurality of elements in the differential delay line;
        a second count value to bypass a second plurality of elements in the single-ended delay line; and
        a third count value to set the interpolator to a maximum delay;
    adjusting the first count value to decrease a number of bypassed elements in the differential delay line until an edge of the output clock signal is delayed with respect to an edge of the input clock signal or the first count value reaches a first count final value;
    if the first count value reaches the first count final value, adjusting the second count value to decrease a number of bypassed elements in the single-ended delay line until the edge of the output clock signal is delayed with respect to the edge of the input clock signal; and
    adjusting the third count value to decrease the delay of the interpolator until the edge of the output clock signal is no longer delayed with respect to the edge of the input clock signal.

2. The method as claimed in claim 1, wherein the input clock signal is a differential input clock signal provided as an input to the differential delay line.

3. The method as claimed in claim 1, wherein the interpolator receives differential output signals of the first and second elements of the differential delay line.

4. The method as claimed in claim 1, wherein the output of the first element of the differential delay line is connected to an input of the second element of the differential delay line.

5. The method as claimed in claim 1, wherein an output of the interpolator is a differential output signal.

6. The method as claimed in claim 5, further comprising converting, using a conversion circuit, the differential output signal of the interpolator to a single ended output signal.

7. The method as claimed in claim 6, wherein the output of the conversion circuit is connected to an input of the single-ended delay line.

8. The method as claimed in claim 1, further comprising converting, using a digital to analog converter, the third count value to one or more control signals provided to the interpolator.

9. The method as claimed in claim 1, wherein the edge of the output clock signal and the edge of the input clock signal are rising edges.

10. The method as claimed in claim 1, wherein the first count value is initialized to a maximum first count value and the first count value is decreased to decrease the number of bypassed elements in the differential delay line.

11. The method as claimed in claim 10, wherein a final value of the first count value is 0.

12. The method as claimed in claim 1, wherein the first plurality of elements in the differential delay line are all the elements in the differential delay line.

13. A method for synchronizing an output clock signal with an input clock signal in a delay locked loop having a multi-element single-ended delay line, a multi-element differential delay line, and an interpolator that receives outputs of first and second elements of the differential delay line, the single-ended delay line, the differential delay line, and the interpolator being arranged such that the input clock passes through all three to provide the output clock signal, the method comprising:
    initializing:
        a first count value to select a first plurality of elements in the differential delay line;
        a second count value to bypass a second plurality of elements in the single-ended delay line; and
        a third count value to set the interpolator a minimum delay;
    adjusting the second count value to decrease a number of bypassed elements in the single-ended delay line until an edge of the output clock signal is delayed with respect to an edge of the input clock signal;
    adjusting the first count value to increase a number of bypassed elements in the differential delay line until the edge of the output clock signal is no longer delayed with respect to the edge of the input clock signal; and
    adjusting the third count value to increase the delay of the interpolator until the edge of the output clock signal is delayed with respect to the edge of the input clock signal.

14. The method for synchronizing an output clock signal with an input clock signal as claimed in claim 13, wherein the input clock signal is a differential input clock signal provided as an input to the differential delay line.

15. The method for synchronizing an output clock signal with an input clock signal as claimed in claim 13, wherein the interpolator receives differential output signals of first and second elements of the differential delay line.

16. The method for synchronizing an output clock signal with an input clock signal as claimed in claim 13, wherein an output of the first element of the differential delay line is connected to an input of the second element of the differential delay line.

17. The method for synchronizing an output clock signal with an input clock signal as claimed in claim 13, wherein an output of the interpolator is a differential output signal.

18. The method for synchronizing an output clock signal with an input clock signal as claimed in claim 17, further comprising converting, using a conversion circuit, the differential output signal of the interpolator to a single ended output signal.

19. The method for synchronizing an output clock signal with an input clock signal as claimed in claim 18, wherein an output of the conversion circuit is connected to an input of the single-ended delay line.

20. The method for synchronizing an output clock signal with an input clock signal as claimed in claim 13, further comprising converting, using a digital to analog converter, the third count value to one or more control signals provided to the interpolator.

21. The method for synchronizing an output clock signal with an input clock signal as claimed in claim 13, wherein the edge of the output clock signal and the edge of the input clock signal are rising edges.

22. The method for synchronizing an output clock signal with an input clock signal as claimed in claim 13, wherein the first count value is initialized to 0 and the first count value is increased to increase the number of bypassed elements in the differential delay line.

23. The method for synchronizing an output clock signal with an input clock signal as claimed in claim 13, wherein the first plurality of elements in the differential delay line are all the elements in the differential delay line.

* * * * *